(12) United States Patent
Yen et al.

(10) Patent No.: US 11,387,113 B2
(45) Date of Patent: *Jul. 12, 2022

(54) METHOD OF FABRICATING SEMICONDUCTOR DEVICE WITH REDUCED TRENCH DISTORTIONS

(71) Applicant: Taiwan Semiconductor Manufacturing Company, Ltd., Hsinchu (TW)

(72) Inventors: Yung-Sung Yen, New Taipei (TW); Chung-Ju Lee, Hsinchu (TW); Chun-Kuang Chen, Hsinchu County (TW); Chia-Tien Wu, Taichung (TW); Ta-Ching Yu, Hsinchu County (TW); Kuei-Shun Chen, Hsinchu (TW); Ru-Gun Liu, Hsinchu County (TW); Shau-Lin Shue, Hsinchu (TW); Tsai-Sheng Gau, HsinChu (TW); Yung-Hsu Wu, Taipei (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/080,248

(22) Filed: Oct. 26, 2020

(65) Prior Publication Data

US 2021/0057231 A1 Feb. 25, 2021

Related U.S. Application Data

(60) Continuation of application No. 16/229,339, filed on Dec. 21, 2018, now Pat. No. 10,818,509, which is a
(Continued)

(51) Int. Cl.
*H01L 21/311* (2006.01)
*H01L 21/033* (2006.01)
(Continued)

(52) U.S. Cl.
CPC .... *H01L 21/31144* (2013.01); *H01L 21/0337* (2013.01); *H01L 21/32139* (2013.01);
(Continued)

(58) Field of Classification Search
CPC .................................................. H01L 21/31144
See application file for complete search history.

(56) References Cited

U.S. PATENT DOCUMENTS 8,039,179 B2 10/2011 Shieh et al.
8,202,681 B2 6/2012 Lin et al.
(Continued)

*Primary Examiner* — Mounir S Amer
(74) *Attorney, Agent, or Firm* — Haynes and Boone, LLP

(57) ABSTRACT

A method includes forming a material layer over a substrate, forming a first hard mask (HM) layer over the material layer, forming a first trench, along a first direction, in the first HM layer. The method also includes forming first spacers along sidewalls of the first trench, forming a second trench in the first HM layer parallel to the first trench, by using the first spacers to guard the first trench. The method also includes etching the material layer through the first trench and the second trench, removing the first HM layer and the first spacers, forming a second HM layer over the material layer, forming a third trench in the second HM layer. The third trench extends along a second direction that is perpendicular to the first direction and overlaps with the first trench. The method also includes etching the material layer through the third trench.

20 Claims, 34 Drawing Sheets

Related U.S. Application Data division of application No. 15/237,898, filed on Aug. 16, 2016, now Pat. No. 10,163,654, which is a continuation of application No. 14/657,763, filed on Mar. 13, 2015, now Pat. No. 9,418,868.

(51) Int. Cl.
*H01L 21/3213* (2006.01)
*H01L 21/768* (2006.01)
*H01L 21/8234* (2006.01)
*H01L 21/8238* (2006.01)

(52) U.S. Cl.
CPC .... *H01L 21/76816* (2013.01); *H01L 21/0332* (2013.01); *H01L 21/0338* (2013.01); *H01L 21/823481* (2013.01); *H01L 21/823878* (2013.01)

(56) References Cited

U.S. PATENT DOCUMENTS

| | | |
|---|---|---|
| 8,247,291 B2 | 8/2012 | Min et al. |
| 8,728,332 B2 | 5/2014 | Lin et al. |
| 8,822,243 B2 | 9/2014 | Yan et al. |
| 8,916,337 B2 | 12/2014 | Arnold et al. |
| 8,969,206 B1 | 3/2015 | Sei et al. |
| 9,054,159 B2 | 6/2015 | Huang et al. |
| 9,799,567 B2 | 10/2017 | Kuo et al. |
| 2006/0091468 A1 | 5/2006 | Liaw |
| 2011/0281208 A1 | 11/2011 | Lin et al. |
| 2012/0278776 A1 | 11/2012 | Lei et al. |
| 2013/0264622 A1 | 10/2013 | Lin et al. |
| 2013/0295769 A1 | 11/2013 | Lin et al. |
| 2013/0313717 A1 | 11/2013 | Holmes et al. |
| 2013/0320451 A1 | 12/2013 | Liu et al. |
| 2014/0193974 A1 | 7/2014 | Lee et al. |
| 2014/0215421 A1 | 7/2014 | Chen et al. |
| 2014/0242794 A1 | 8/2014 | Lin et al. |
| 2014/0264760 A1 | 9/2014 | Chang et al. |
| 2014/0264899 A1 | 9/2014 | Chang et al. |
| 2014/0273442 A1 | 9/2014 | Liu et al. |
| 2014/0273446 A1 | 9/2014 | Huang et al. |
| 2014/0273471 A1 | 9/2014 | Gwak |
| 2015/0093902 A1 | 4/2015 | Huang et al. |
| 2015/0221549 A1 | 8/2015 | Ponoth et al. |
| 2015/0294905 A1 | 10/2015 | Wu et al. |
| 2015/0311113 A1 | 10/2015 | Zhang et al. |
| 2015/0318209 A1 | 11/2015 | Chang et al. |
| 2016/0225768 A1 | 8/2016 | Cheng et al. |
| 2016/0358788 A1 | 12/2016 | Yen et al. |
| 2017/0263865 A1 | 9/2017 | Liu et al. |
| 2019/0122895 A1 | 4/2019 | Yen et al. |

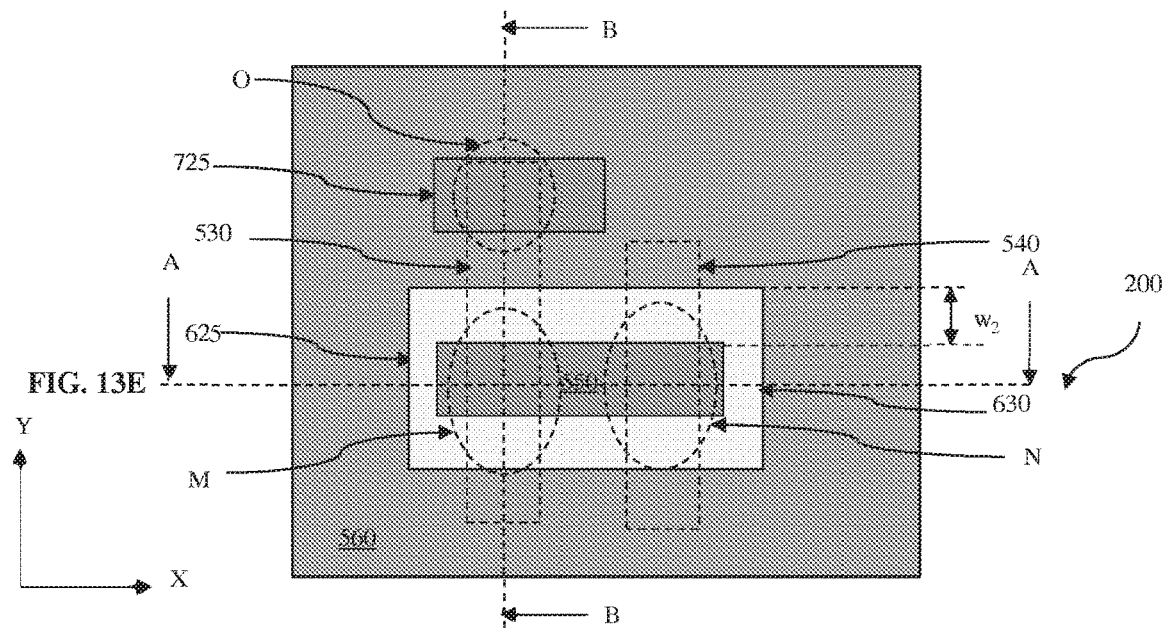
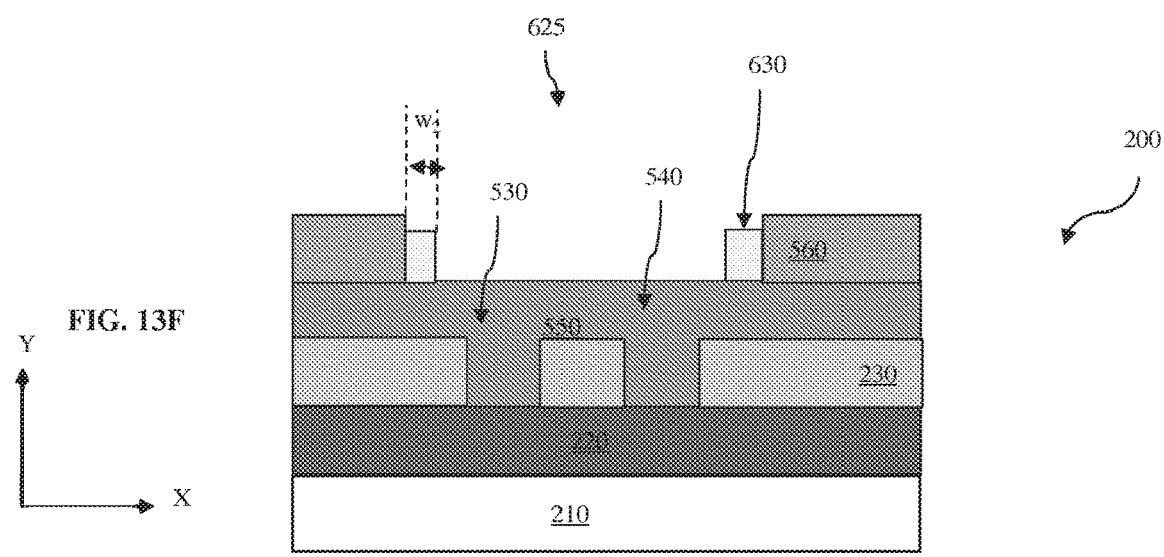
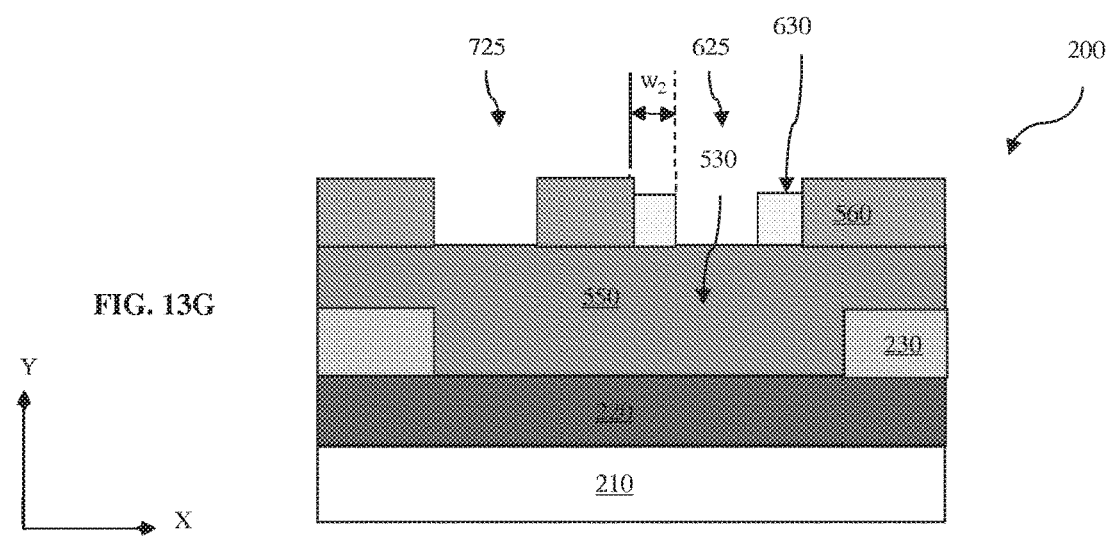

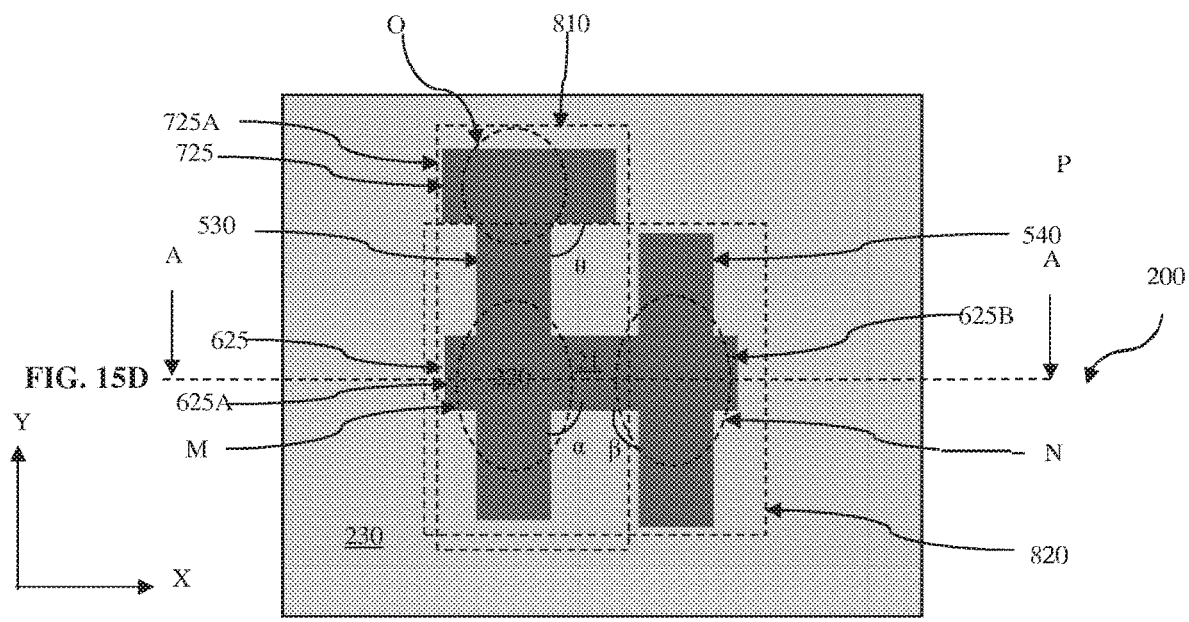
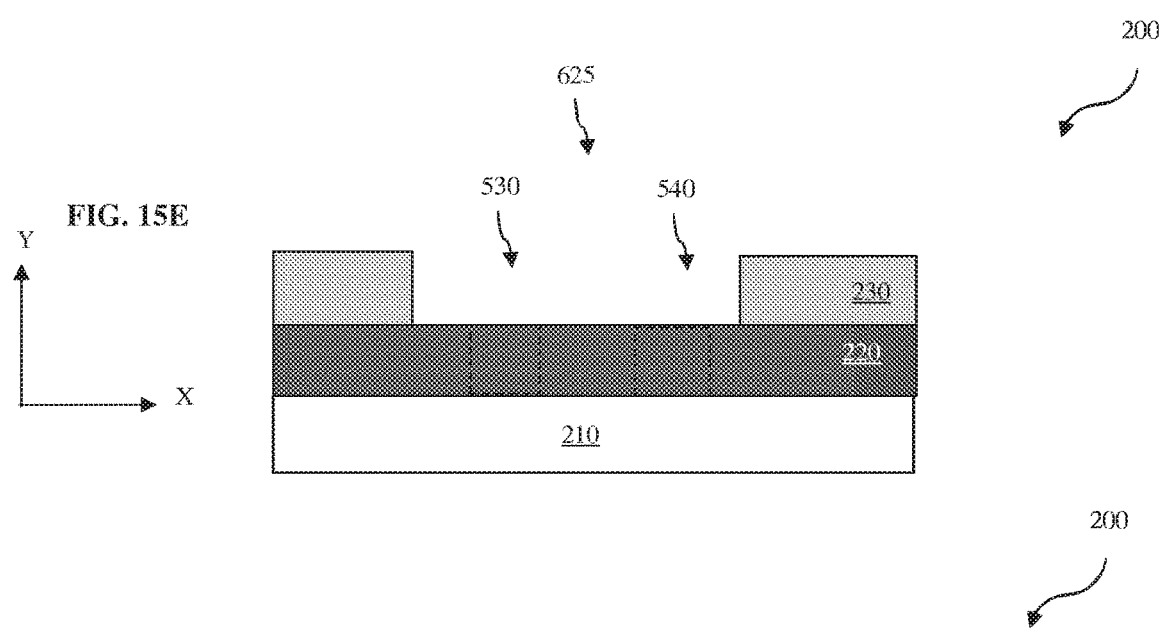

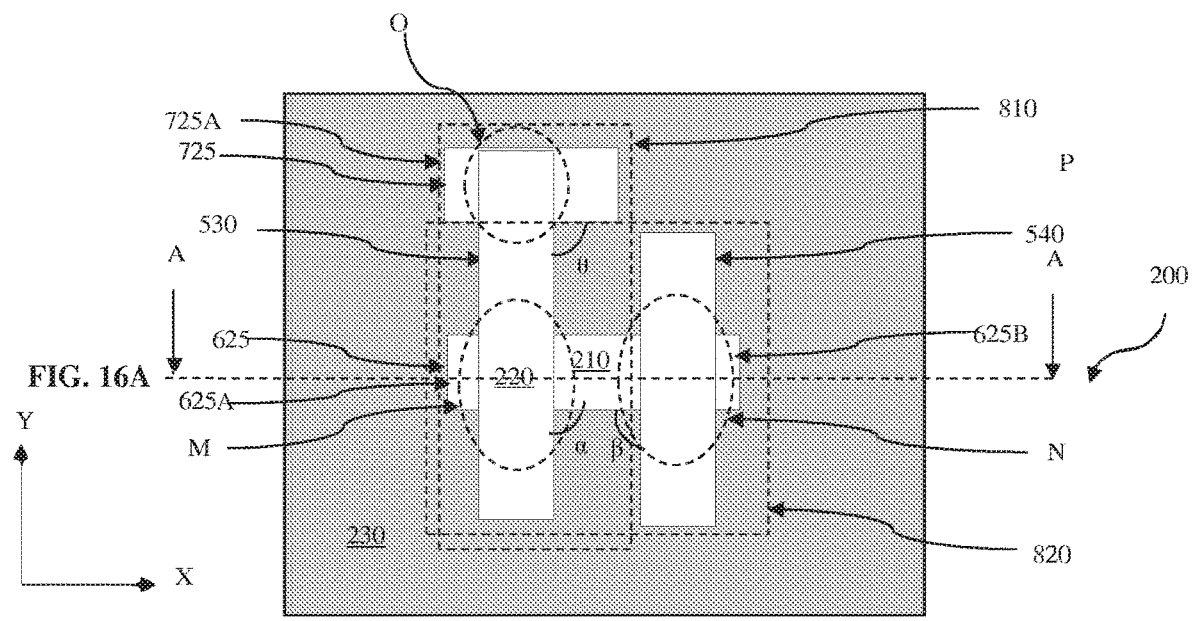
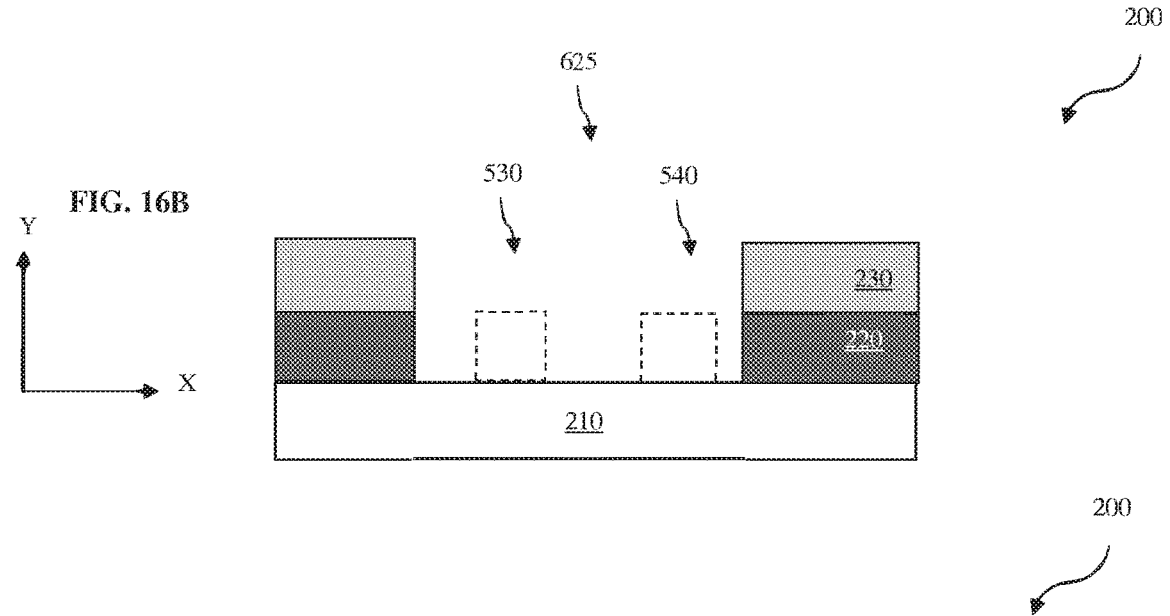

METHOD OF FABRICATING SEMICONDUCTOR DEVICE WITH REDUCED TRENCH DISTORTIONS

PRIORITY DATA

The present application is a continuation application of U.S. application Ser. No. 16/229,339, filed Dec. 21, 2018, which is a divisional application of U.S. application Ser. No. 15/237,898, filed Aug. 16, 2016, which is a continuation application of U.S. application Ser. No. 14/657,763, filed Mar. 13, 2015, each of which is hereby incorporated by reference in its entirety.

BACKGROUND

The semiconductor integrated circuit (IC) industry has experienced rapid growth. Technological advances in IC design and material have produced generations of ICs where each generation has smaller and more complex circuits than previous generations. In the course of IC evolution, functional density (i.e., the number of interconnected devices per chip area) has generally increased while geometry size (i.e., the smallest component (or line) that can be created using a fabrication process has decreased. When a semiconductor device such as a metal-oxide-semiconductor field-effect transistor (MOSFET) is scaled down through various technology nodes, challenges rise to reduce irregularities/distortions in features/patterns formed over a wafer.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

FIG. 13E is a top view of an example of a semiconductor device in accordance with some embodiments.

FIG. 13F is a cross-sectional view of an example semiconductor device in accordance with some embodiments, along the line A-A in FIG. 13E.

FIG. 13G is a cross-sectional view of an example semiconductor device in accordance with some embodiments, along the line B-B in FIG. 13E.

FIG. 15D is a top view of an example of a semiconductor device in accordance with some embodiments.

FIG. 15E is a cross-sectional vies of an example semiconductor device in accordance with some embodiments, along the line A-A in FIG. 15D.

FIGS. 16A and 16C are top view of an example of a semiconductor device in accordance with some embodiments.

FIGS. 16B and 16D are cross-sectional views of an example semiconductor device in accordance with some embodiments, along the line A-A in FIGS. 16A and 16C, respectively.

DETAILED DESCRIPTION

Figure 1:
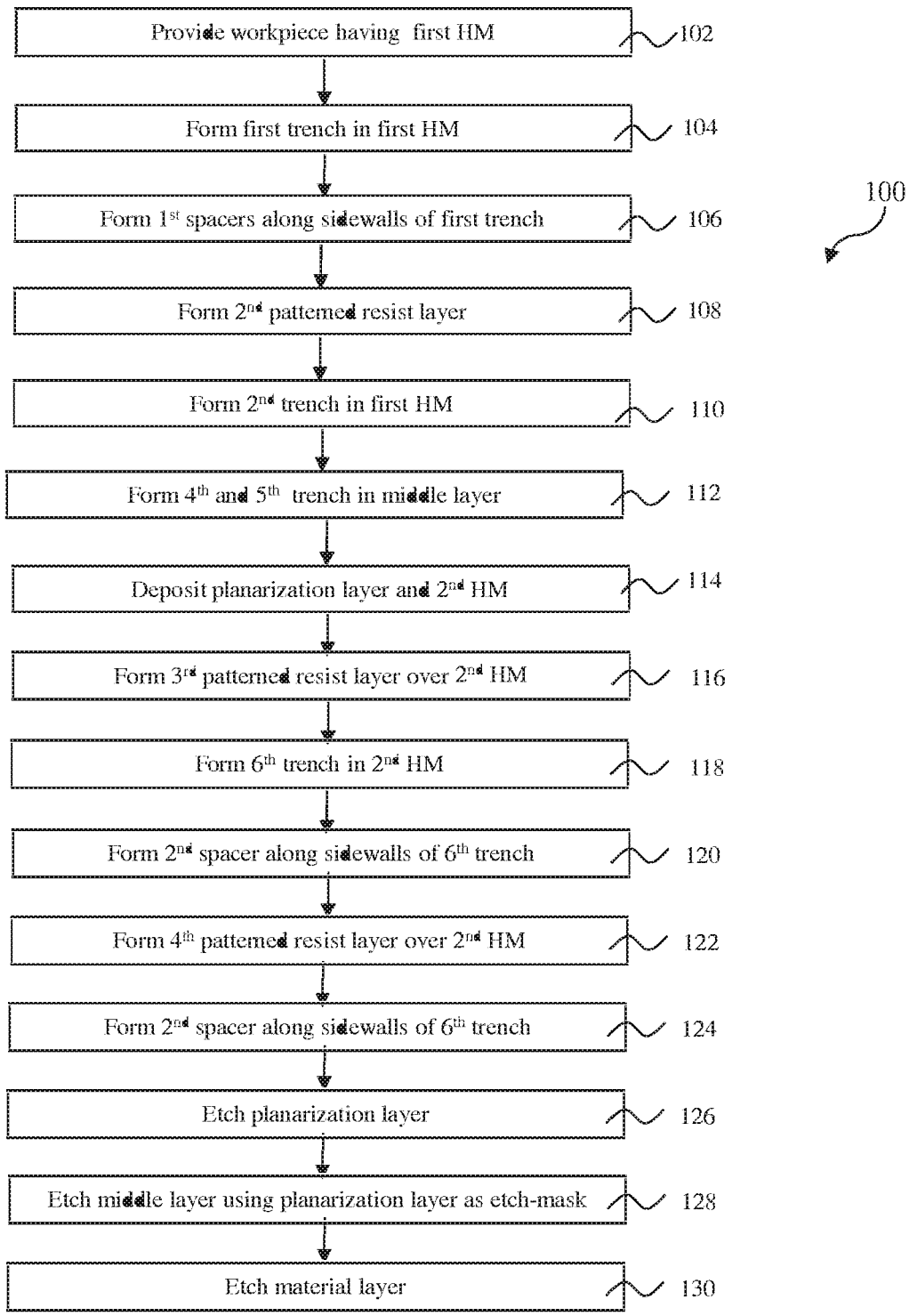
FIG. 1 is a flowchart of an example method for fabricating a semiconductor device constructed in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart of a method 100 of fabricating one or more semiconductor devices in accordance with some embodiments. The method 100 is discussed in detail below, with reference to a workpiece 205 of a semiconductor device 200 shown in FIG. 2 and the semiconductor device 200, shown in FIGS. 4A to 17C.

Figure 2:
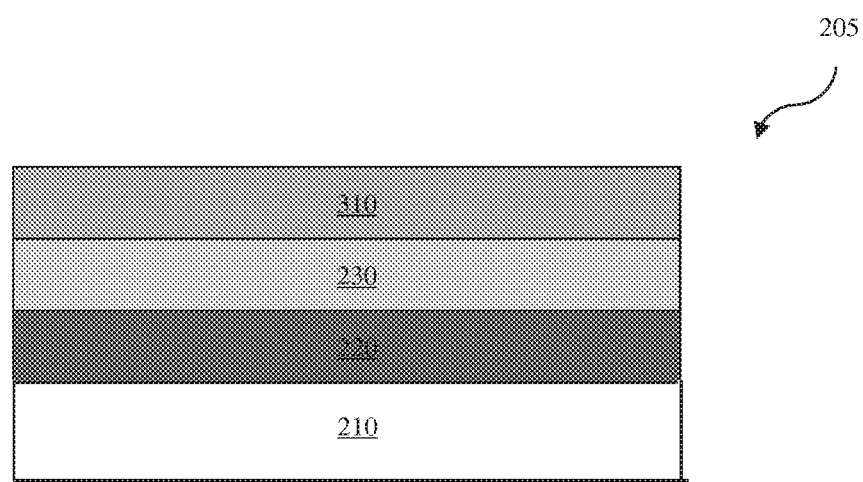
FIG. 2 is a cross section view of an example of a workpiece of a semiconductor device in accordance with some embodiments.

Referring to FIGS. 1 and 2, the method 100 starts at step 102 by receiving a workpiece 205 of the semiconductor device 200. The workpiece 205 includes a substrate 210. The substrate 210 may be a bulk silicon substrate. Alternatively, the substrate 210 may comprise an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. Possible substrates 210 also include a silicon-on-insulator (SOI) substrate. SOI substrates are fabricated using separation by implantation of oxygen (SIMOX), wafer bonding, and/or other suitable methods.

Some exemplary substrates 210 also include an insulator layer. The insulator layer comprises any suitable material, including silicon oxide, sapphire, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary semiconductor device 200, the insulator layer is a component (e.g., layer) of a silicon-on-insulator substrate.

The substrate 210 may also include various p-type doped regions and/or n-type doped regions, implemented by a process such as ion implantation and/or diffusion. Those doped regions include n-well, p-well, light doped region (LDD), doped source and drain (S/D), and various channel doping profiles configured to form various integrated circuit (IC) devices, such as a complimentary metal-oxide-semiconductor field-effect transistor (CMOSFET), imaging sensor, and/or light emitting diode (LED). The substrate 210 may further include other functional features such as a resistor or a capacitor formed in and on the substrate.

The substrate 210 may also include various isolation features. The isolation features separate various device regions in the substrate 210. The isolation features include different structures formed by using different processing technologies. For example, the isolation features may include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features.

The substrate 210 may also include gate stacks formed by dielectric layers and electrode layers. The dielectric layers may include an interfacial layer (IL) and a high-k (HK) dielectric layer deposited by suitable techniques, such as chemical vapor deposition (CVD), atomic layer deposition (ALD), physical vapor deposition (PVD), thermal oxidation, combinations thereof, or other suitable techniques. The electrode layers may include a single layer or multi layers, such as metal layer, liner layer, wetting layer, and adhesion layer, formed by ALD, PVD, CVD, or other suitable process.

The substrate 210 may also include a plurality of inter-level dielectric (ILD) layers and conductive features integrated to form an interconnect structure configured to couple the various p-type and n-type doped regions and the other functional features (such as gate electrodes), resulting a functional integrated circuit.

In the present embodiment, the workpiece 205 includes a first material layer 220 (or main layer) over the substrate 210, a second material layer 230 (or middle layer) over the first material layer 220 and a first hard mask (HM) 310 deposited over the second material layer 230. The first material layer 220 and the second material layer 230 may include a dielectric layer, such as silicon oxide, silicon nitride, or silicon oxynitride, low-k dielectric material, or other suitable materials. The first material layer 220 may also include a conductive layer such as a polysilicon, a metal layer, or/and other suitable material. In the present embodiment, the second material layer 230 may include a material which is different from the first material layer 220 to achieve etching selectivity during subsequent etch processes. The first HM 310 may include silicon oxide, silicon nitride, oxynitride, silicon carbide, titanium oxide, titanium nitride, tantalum oxide, tantalum nitride, and/or any suitable materials. In the present embodiment, the first HM 310 may include a material which is different from the first material layer 220 and the second material layer 230 to achieve etching selectivity during subsequent etch processes. The first material layer 220, the second material layer 230 and the first HM 310 may be deposited over the substrate 210 by suitable techniques, such as chemical vapor deposition (CVD), atomic layer deposition (ALD), physical vapor deposition (PVD), thermal oxidation, combinations thereof, or other suitable techniques.

In the present embodiment, a plurality of features (e.g. trenches) is to be formed in the first material layer 220. In order to form trenches in the first material layer 220, it is usually to form a patterned resist layer with openings over the first HM 310 first, then etching the first HM 310 through openings to pattern the first HM 310, and then etching the first material layer 220 through the patterned first HM 310 to form trenches. The patterned resist layer may be formed by a lithography process equipped with an optical imaging tool.

Figure 3A:
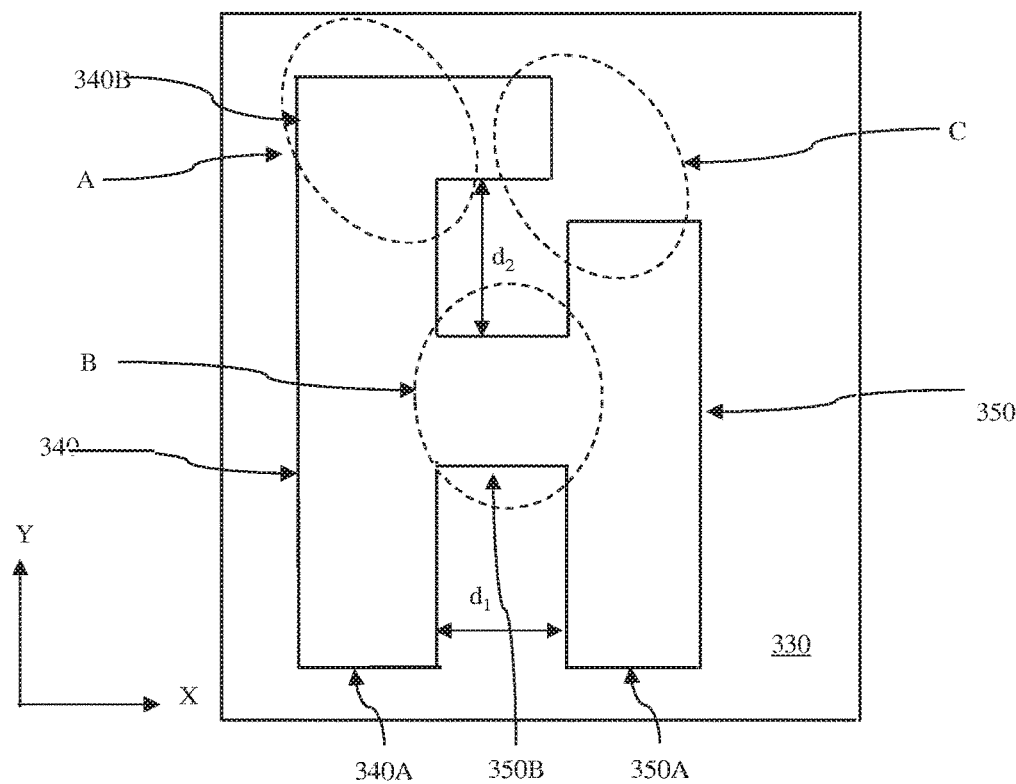
FIGS. 3A and 3B are schematic views of patterns formed over a resist layer by a lithography process.

FIG. 3A shows an ideal patterned resist layer 330 which includes a first opening 340 having a L-shape, that has a first portion 340A extending along a first direction (Y direction) and a second portion 340B extending along a second direction (X direction), which is perpendicular to the first direction. The first portion 340A connects to the second portion 340B at a location A. The patterned resist layer 330 also includes a second opening 350 having a T-shape that has a third portion 350A and a fourth portion 350B. The third portion 350A extends along the Y direction and spaces from the first portion 340A by a first distance $d_1$. The fourth portion 350B extends along the X direction and connects to (or intersects) the first portion 340A at a location B. The fourth portion 350B is spaced from the second portion 340B by a second distance $d_2$. The third portion 350B is located close to an end of the second portion 340B at a location C. It desired that the first and second openings, 340 and 350 remain regular contour (such as a rectangular contour) at each end of the openings. It is also desired that the first portion 340A connects to the second portion 340B with a right angle (90 degree) at the location A and similarly that the third portion 350A connects to the fourth portion 350B and the fourth portion 350B connects to the first portion 340A at the location B with right angle (90 degree) connecting angles.

Figure 3B:
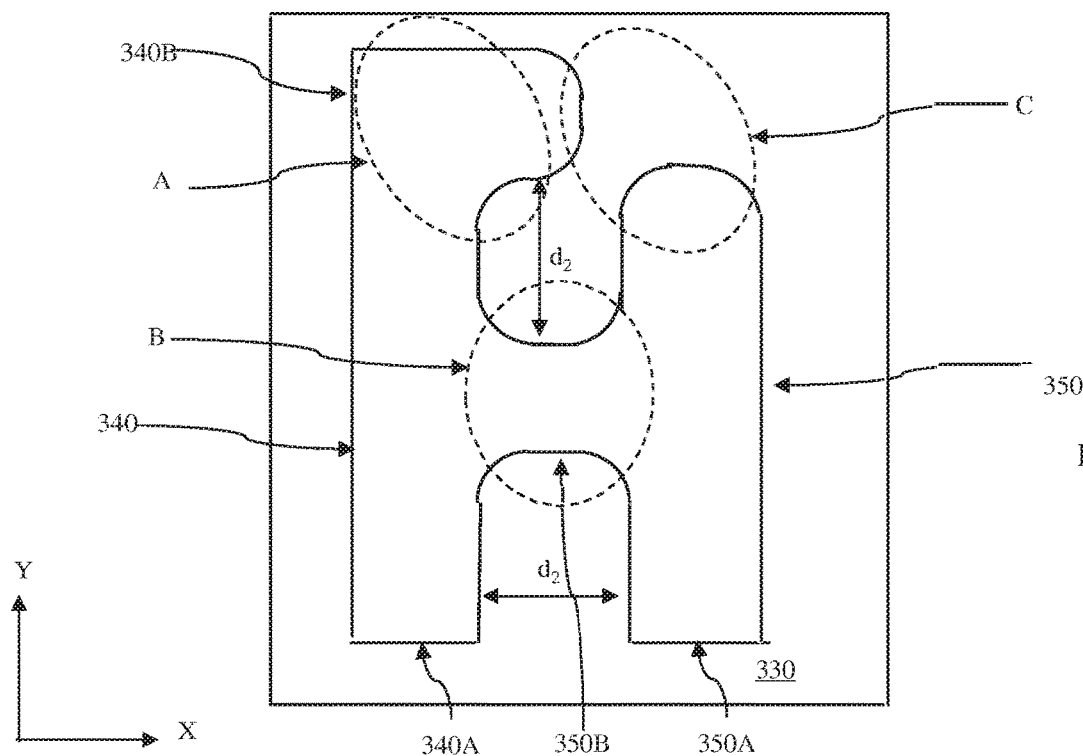

However, due to diffraction, resolution and other process effect of the optical imaging tool in a lithography process, irregularities/distortions in resist patterns (openings) may happen. FIG. 3B shows such problems that can occur to patterned resist layer 330. For example, when the first and second openings, 340 and 350, are formed over a resist layer, rounded corner distortions may be formed at the locations A and B, instead of right angle connecting angles. Furthermore, when the first and second openings, 340 are 350 locate closely to each other such that a distance between them is smaller than a threshold distance $d_t h$ of a lithography exposure process, they may have line end shortening distortions at locations (see e.g. location C of FIG. 3B). Furthermore, when the first and second distance, $d_1$ and $d_2$, are small, challenges raise for overcoming misalignment. If these irregularities/distortions and misalignment are transferred to form features (such as trenches) over a layer (such as the first material layer 220), it may significantly alter the electrical properties of the semiconductor device 200. The present discourse provides methods to reduce irregularities/distortions and overcome misalignment in forming features in the first material layer 220.

Figure 4A:
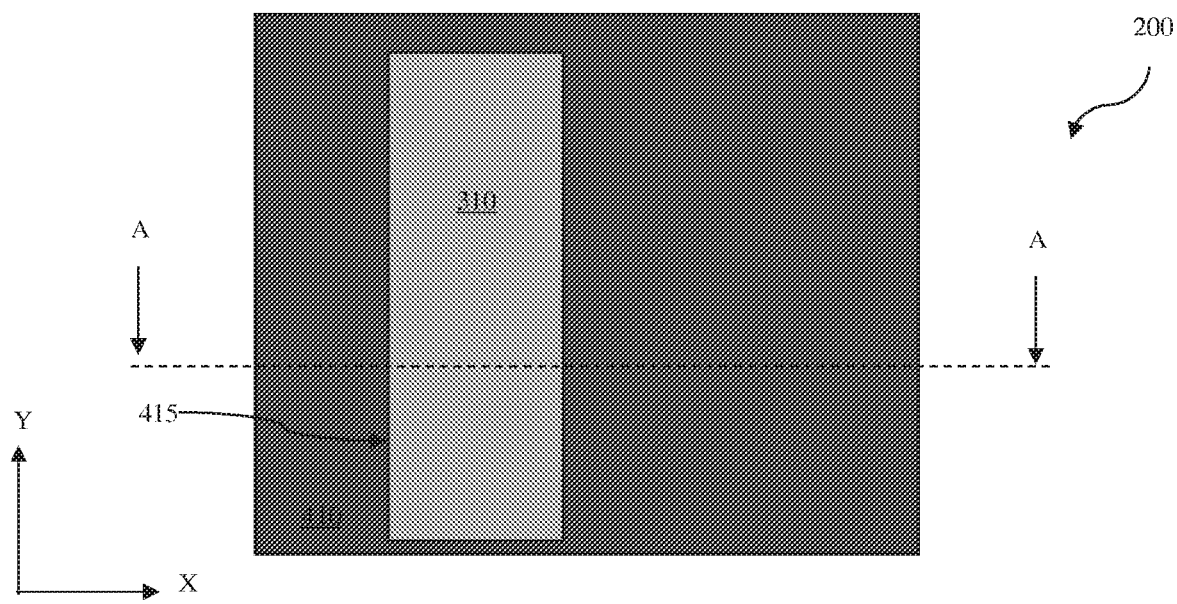
FIGS. 4A and 4C are top views of an example of a semiconductor device in accordance with some embodiments.
Figure 4B:
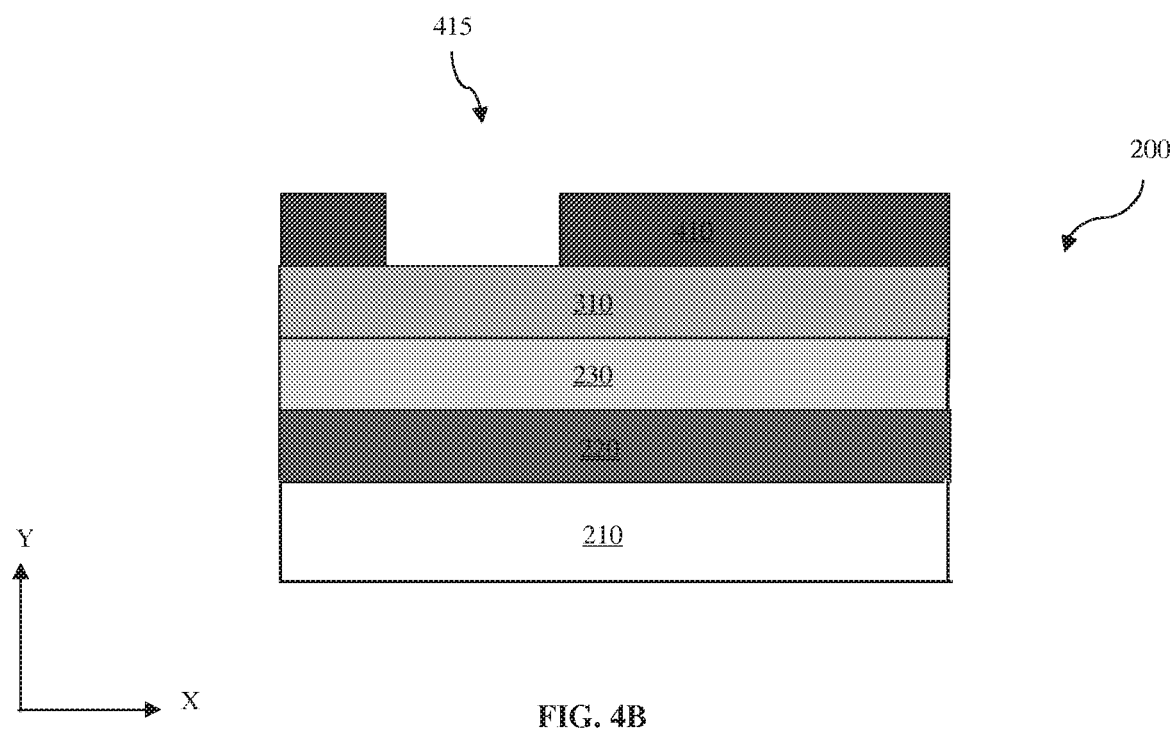
FIGS. 4B and 4D are cross-sectional views of an example semiconductor device in accordance with some embodiments, along the line A-A in FIGS. 4A and 4C, respectively.

Referring to FIGS. 1 and 4A-4D, once the workpiece 205 is received, method 100 proceeds to step 104 by forming a first trench 425 in the first HM 310. In some embodiment, in order to form the first trench 425, a first patterned resist layer 410 is formed over the first HM 310 by a lithography process. The first patterned resist layer 410 has a first opening 415, which has a rectangular shape and extends along the Y-direction. Respective portions of the first HM 310 are exposed in the first opening 415, as shown in FIGS. 4A-4B. An exemplary lithography process may include forming a resist layer, exposing the resist layer by a lithography exposure process, performing a post-exposure bake process, and developing the resist layer to form the patterned resist layer.

Figure 4C:
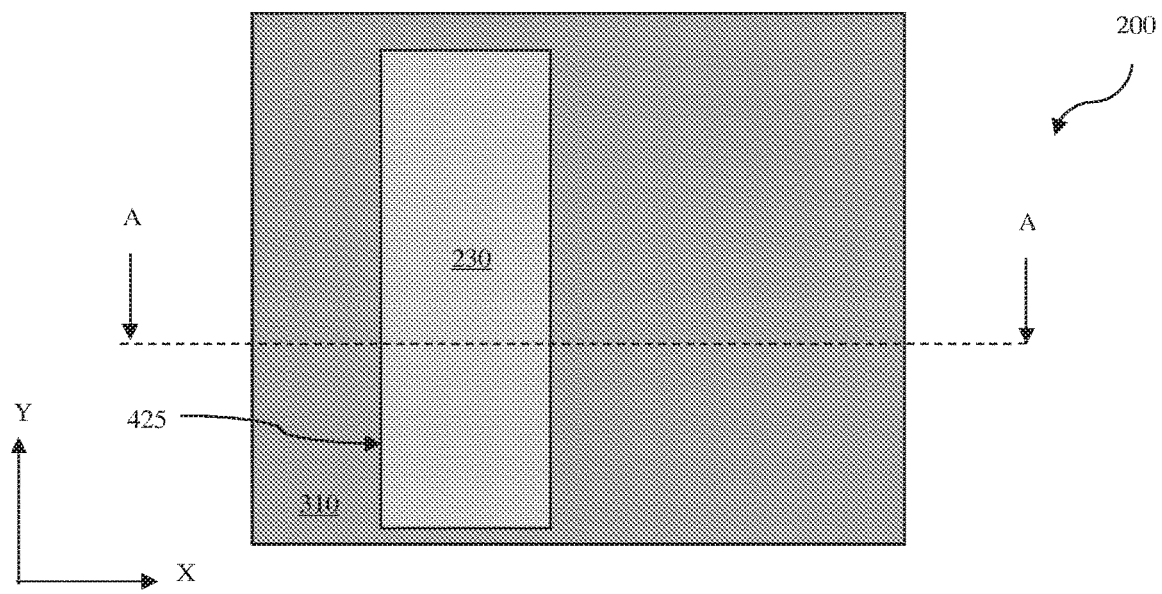
Figure 4D:
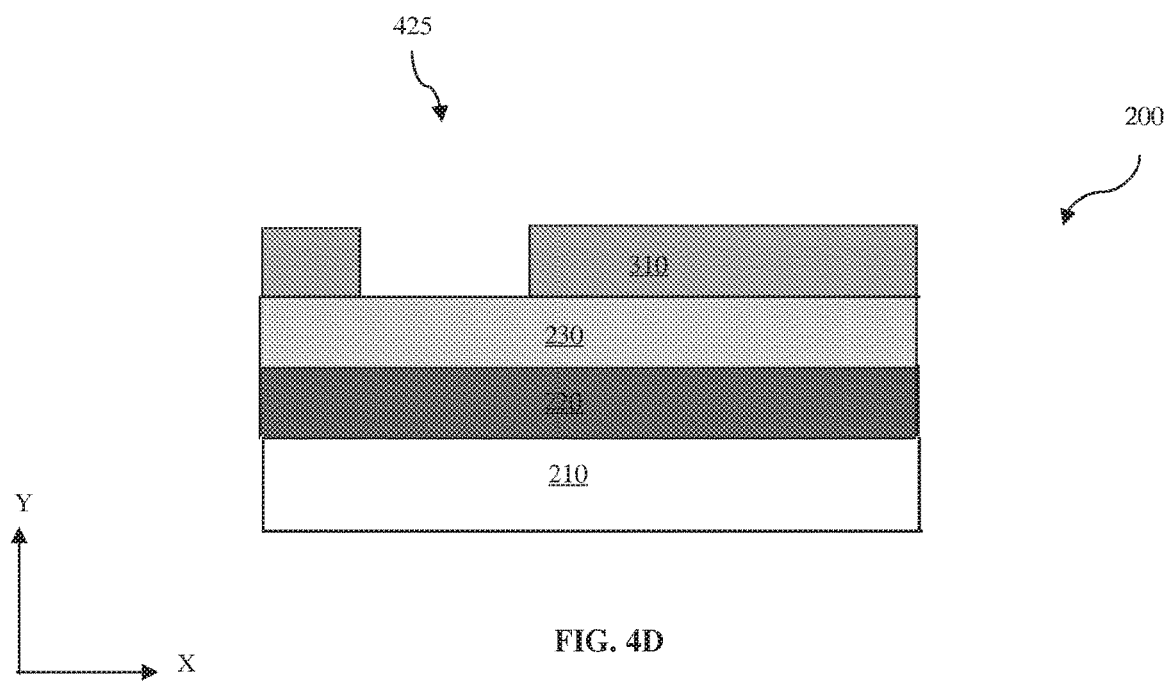

The first HM 310 is then etched through the first patterned resist 410 to transfer the first opening 415 to the first trench 425. The etch process may include wet etch, dry etch, or a combination thereof. In some embodiments, the etch process includes an anisotropic dry etch. For example, the etch process is a plasma anisotropic etch. In some embodiments, the etch process is properly chosen to selectively etch the first HM 310 without substantially etching the second material layer 230. As has been mentioned previously, with an adequate etch selectivity, the second material layer 230 serves as an etch stop layer, which improves etch process window and profile control. A resist strip process is then applied to remove any remaining first patterned resist layer 410, as shown in FIGS. 4C-4D.

Figure 5A:
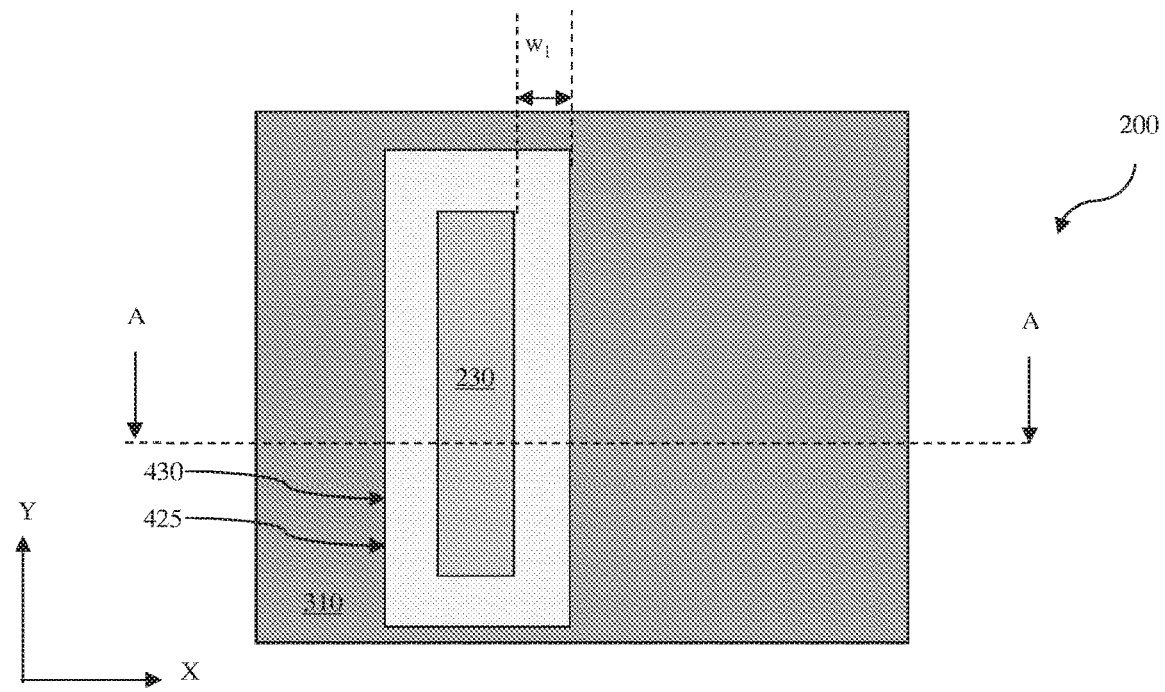
FIG. 5A is a top view of an example of a semiconductor device in accordance with some embodiments.
Figure 5B:
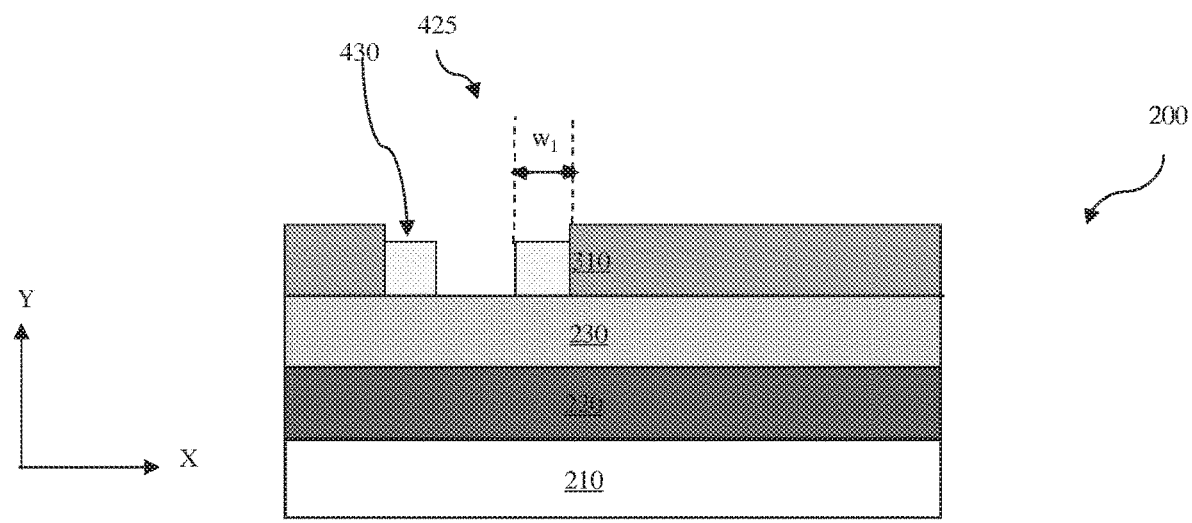
FIG. 5B is a cross-sectional view of an example semiconductor device in accordance with some embodiments, along the line A-A in FIG. 5A.

Referring to FIGS. 1 and 5A-5B, the method 100 proceeds to step 106 by forming first spacers 430 along sidewalls of the first trench 425. In the present embodiment, the first spacers 430 include a material which is different from the first HM 310 to achieve etching selectivity subsequent etch. The first spacers 430 may be formed by depositing a spacer layer over the first HM 310, and followed by a spacer etch to etch the spacer layer anisotropically. The spacer layer may include silicon oxide, silicon nitride, oxynitride, silicon carbide, titanium oxide, titanium nitride, tantalum oxide, tantalum nitride, or any suitable materials. The spacer layer may be deposited by CVD, ALD, PVD, or other suitable techniques. In one embodiment, the spacer layer is etched by an anisotropic dry etch to form a vertical profile, which will be transferred to a profile of a trench feature later. By controlling the thickness of the spacer layer and spacer etching process, the first spacers 430 are formed to have a first width $w_1$.

Figure 6A:
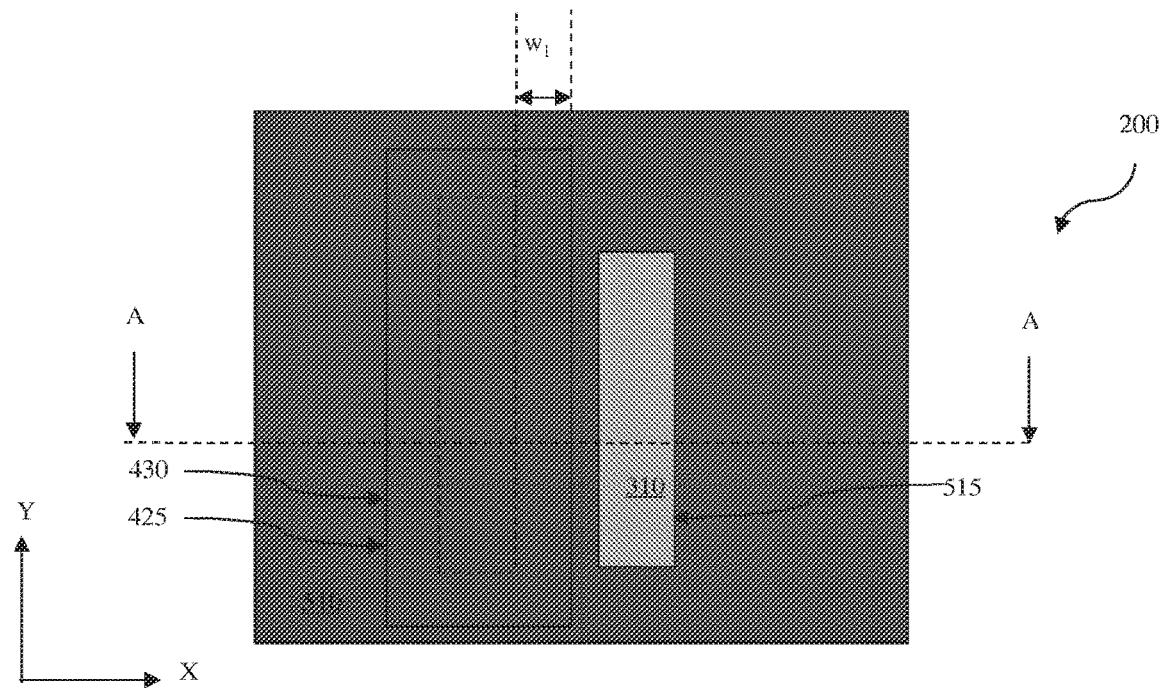
FIGS. 6A and 6C are top views of an example of a semiconductor device in accordance with some embodiments.
Figure 6B:
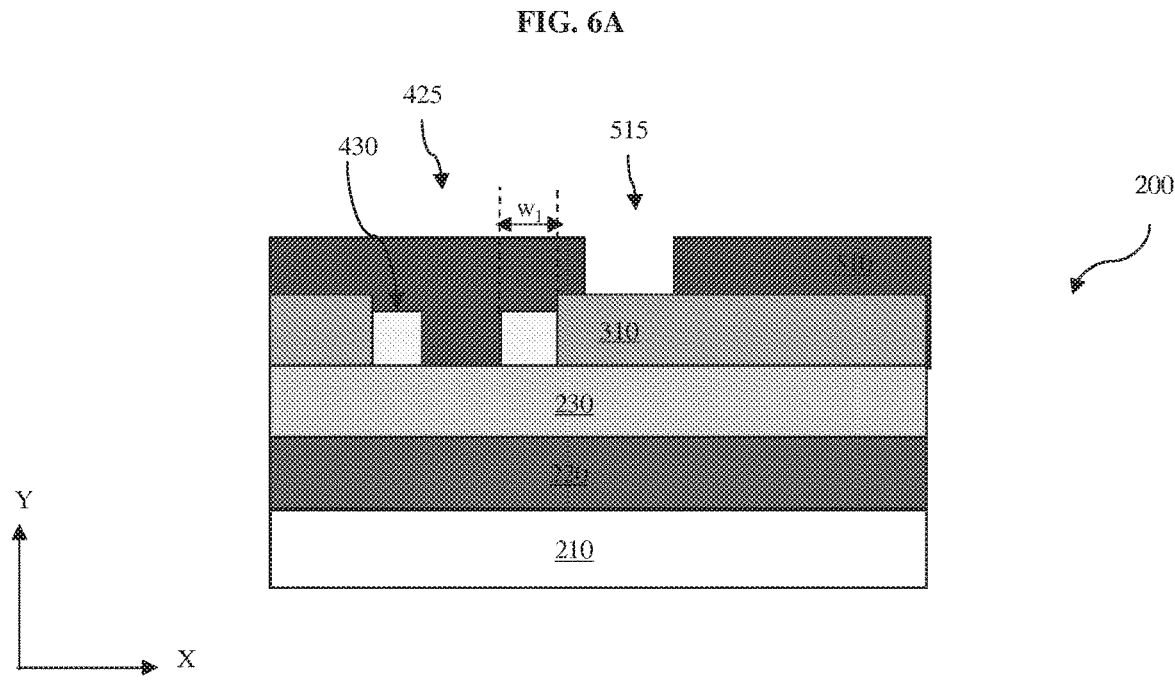
FIGS. 6B and 6D are cross-sectional views of an example semiconductor device in accordance with some embodiments, along the line A-A in FIGS. 6A and 6C, respectively.

Referring to FIGS. 1 and 6A-6B, the method 100 proceeds to step 108 by forming a second patterned resist layer 510 over the first HM 310 and within first trench 425. The second patterned resist layer 510 has a second opening 515, which extends along the X direction and is parallel to the first trench 425. A respective portion of the first HM 310 is exposed within the second opening 515. The second patterned resist layer 510 is formed similarly in many respects to the first patterned resist layer 410 discussed above association with FIGS. 4A-4B.

In the present embodiment, the second opening 515 is defined by the second patterned resist layer 510 while the first opening 415 has been defined by the first patterned resist layer 410. Thus line end shortening distortions, induced by threshold distance $d_{th}$ constrain in the lithography exposing process, are greatly reduced.

Figure 6C:
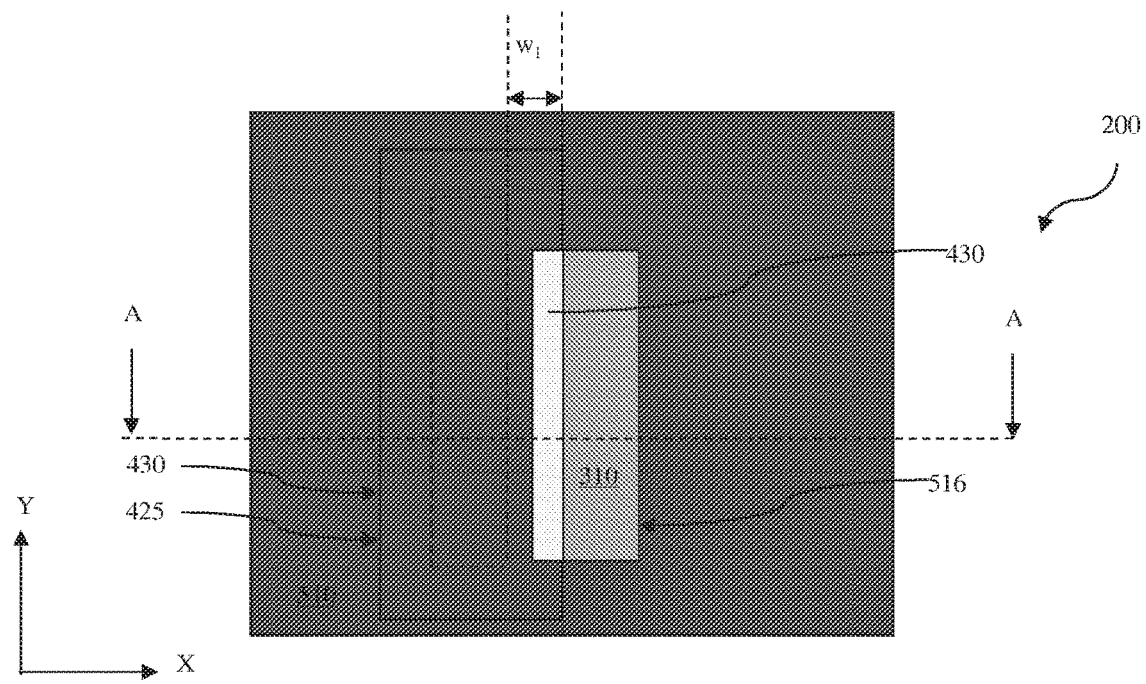
Figure 6D:
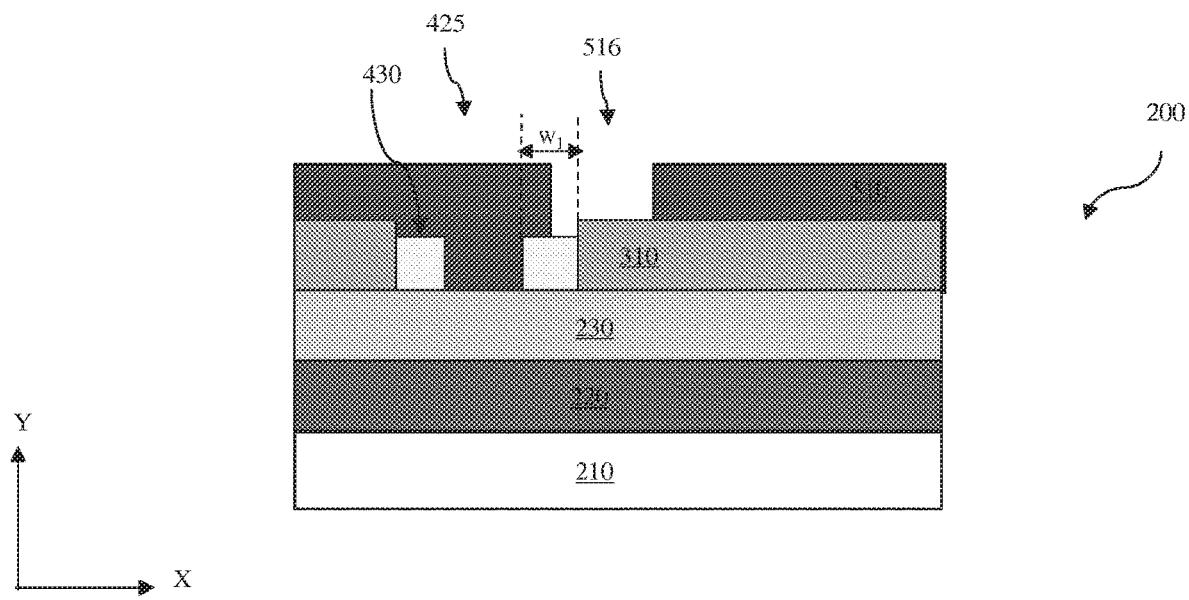

In some embodiments, referring to FIGS. 6C-6D, the second opening is positioned closer to the first trench 425. Thus, in some embodiments the first HM 310 and a portion of the adjacent first spacer 430 are exposed within the second opening (referred to as 516 as shown in FIGS. 6C-6D). Sometimes the exposure of the adjacent first spacer 430 is caused by adverse process impacts, such as misalignment, pattern irregularities/distortions in the lithography process of forming the second patterned resist layer 510. In still other embodiments, the second opening 516 has a larger width such that it extends to the adjacent first spacer 430 to obtain advantages, such as relaxing lithography process resolution constrains.

Figure 7A:
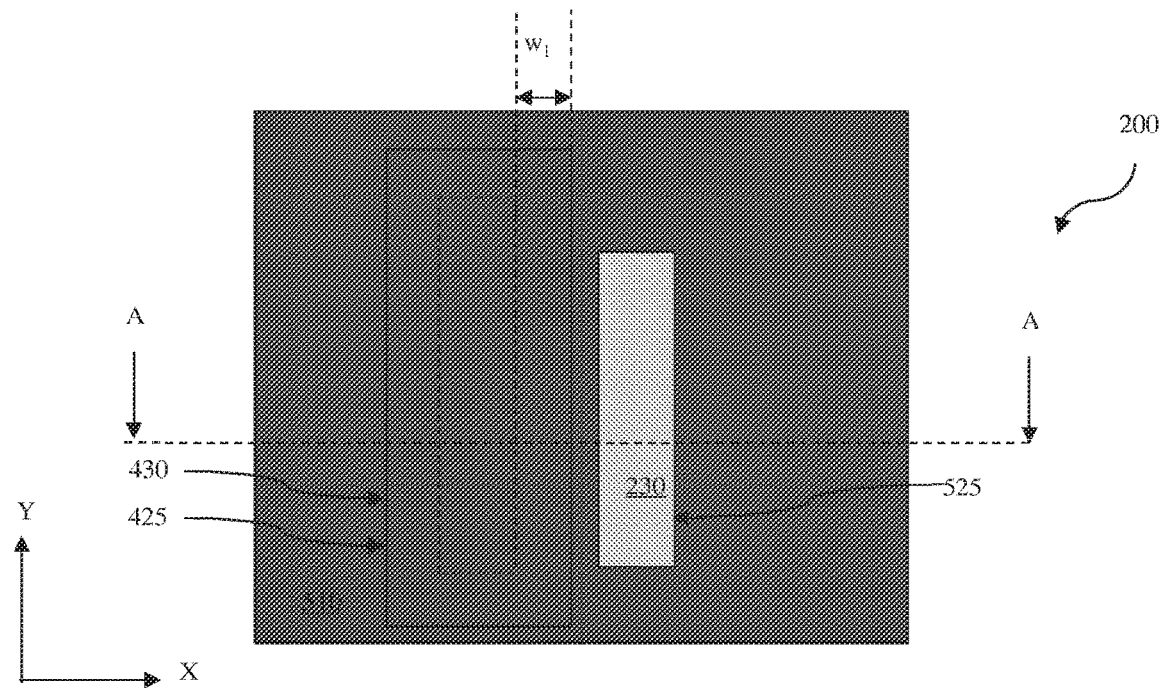
FIGS. 7A, 7C, 7E and 7G are top views of an example of a semiconductor device in accordance with some embodiments.
Figure 7B:
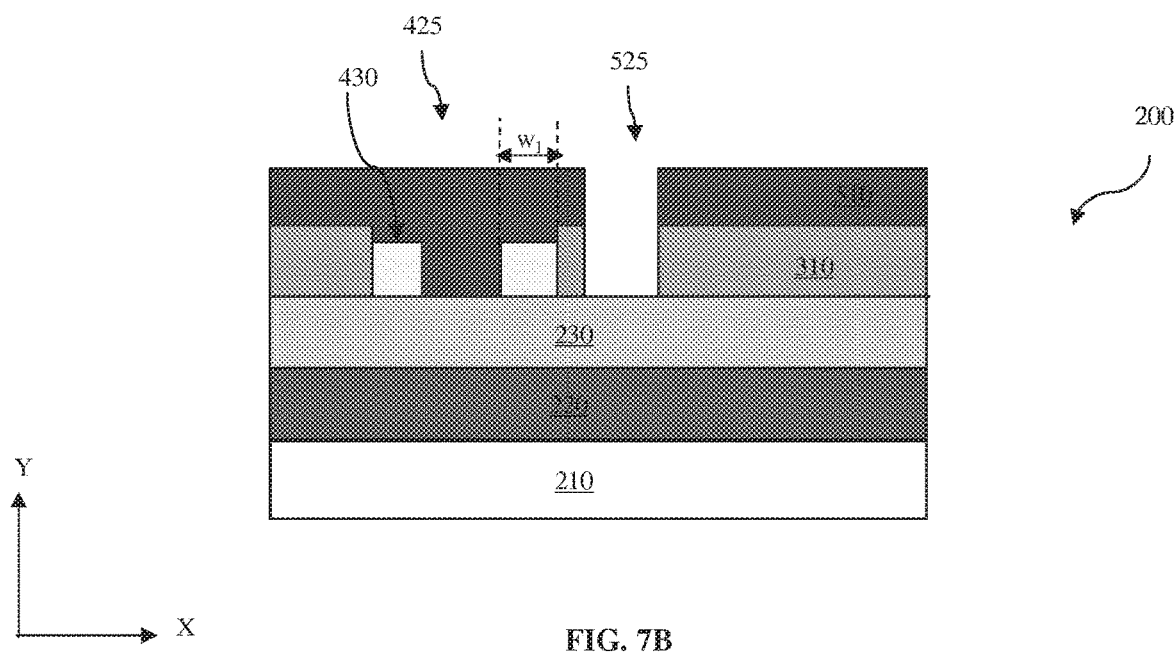
FIGS. 7B, 7D, 7F and 7H are cross-sectional views of an example semiconductor device in accordance with some embodiments, along the line A-A in FIGS. 7A, 7C, 7E and 7G, respectively.

Referring to FIGS. 1 and 7A-7B (in conjunction with the process described with respect to FIGS. 6A-6B), method 100 proceeds to step 110 by etching the first HM 310 through the second opening 515 to form a second trench 525 in the first HM 310. A portion of the second material layer 230 is exposed in the second trench 525. The etch process may include wet etch, dry etch, or a combination thereof.

Figure 7C:
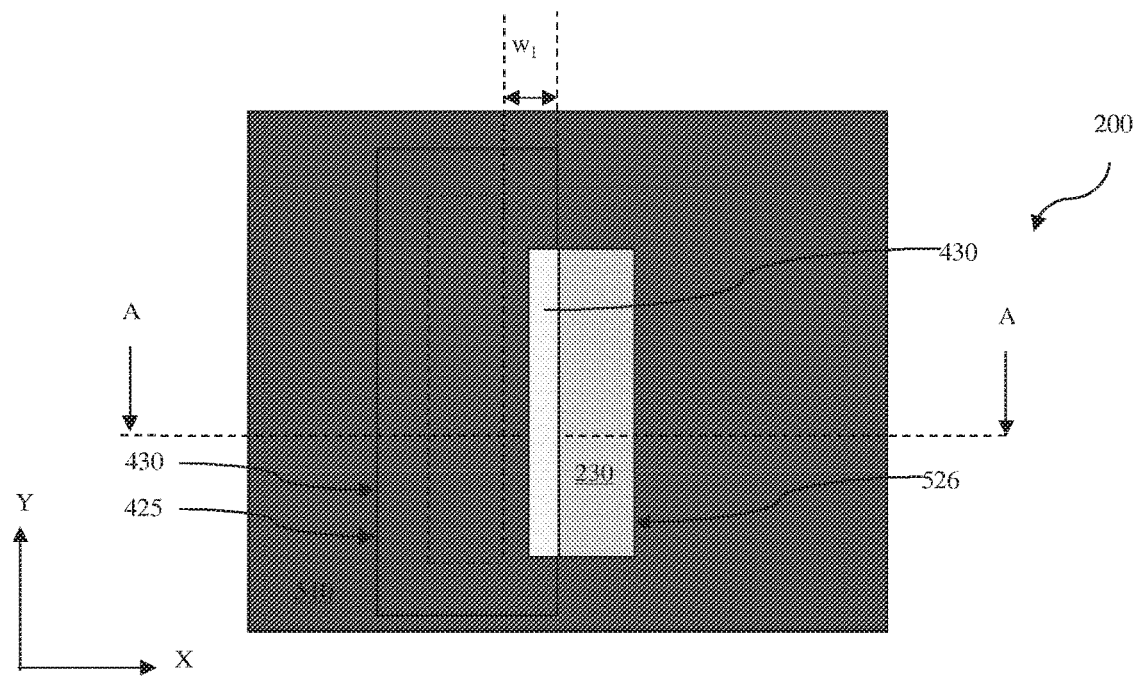
Figure 7D:
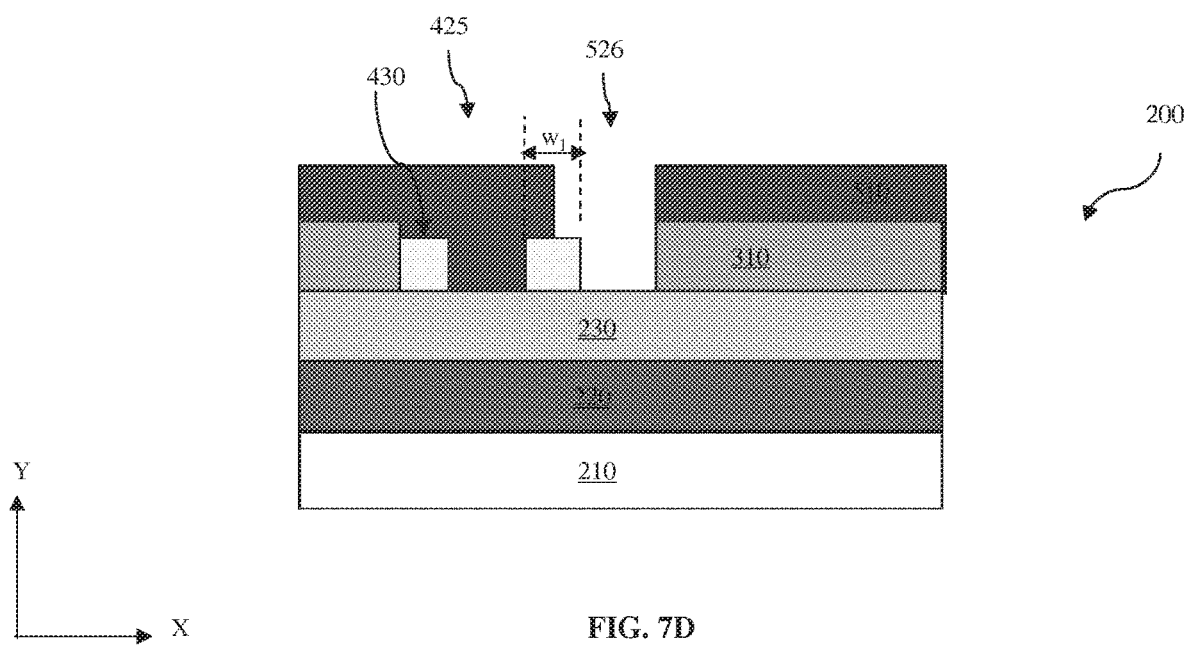

As discussed above in reference to FIGS. 6C-6D, in some embodiments the second opening is positioned closer to the first trench 425 such that the first HM 310 and a portion of the adjacent first spacer 430 are exposed within the second opening (referred to as 516 as shown in FIGS. 6C-6D). In such a scenario, the etch process is properly chosen to selectively etch the first HM 310 without substantially etching the first spacer 430. Thus, the portion of the adjacent first spacer 430 exposed within the second opening 516 serves as a sub-etch-mask (or guards the first trench 425) during etching the first HM 310 through the second opening 516 to form a third trench 526, as shown in FIGS. 7C-7D in this alternative embodiment.

Figure 7E:
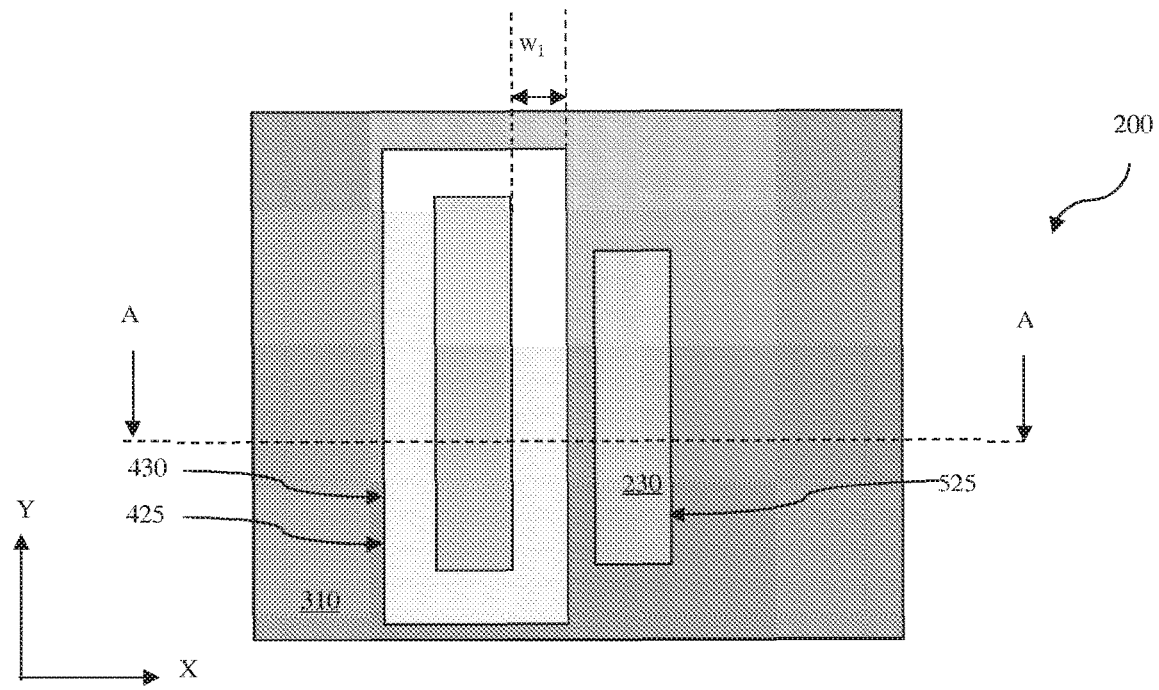
Figure 7F:
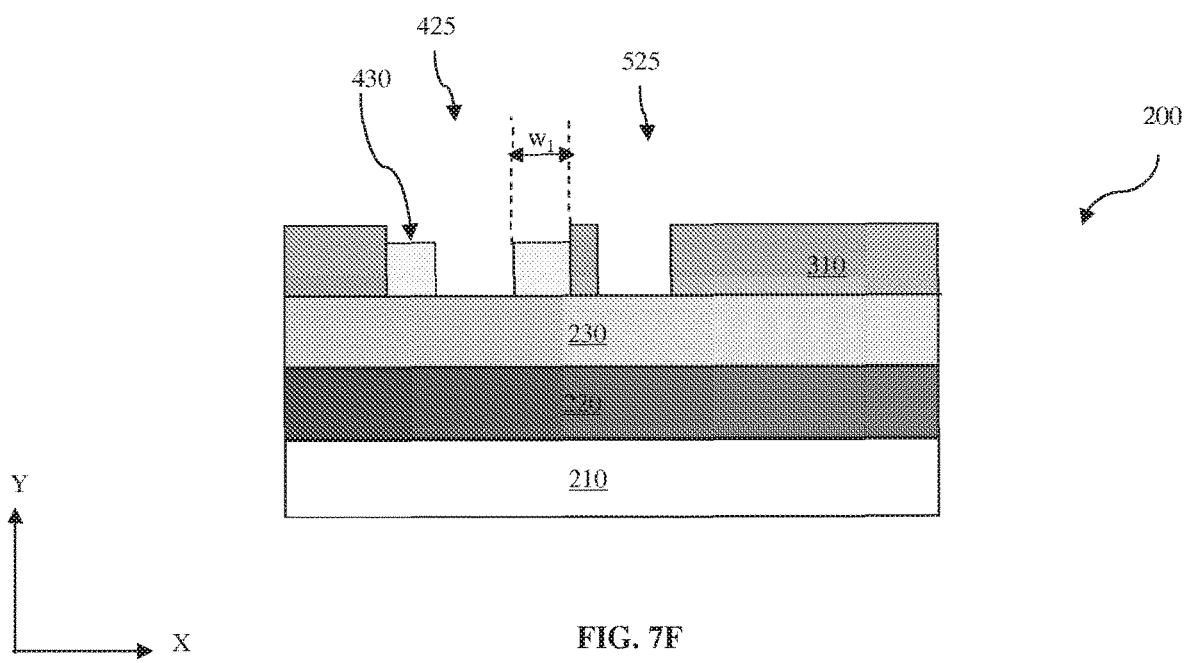
Figure 7G:
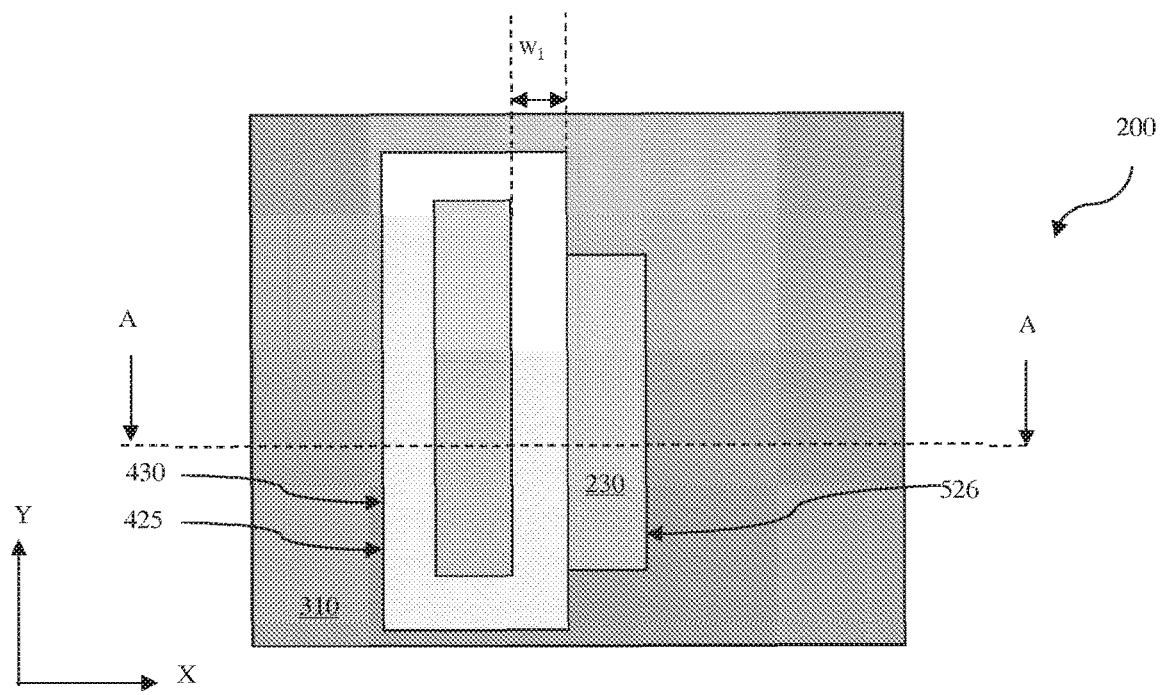
Figure 7H:
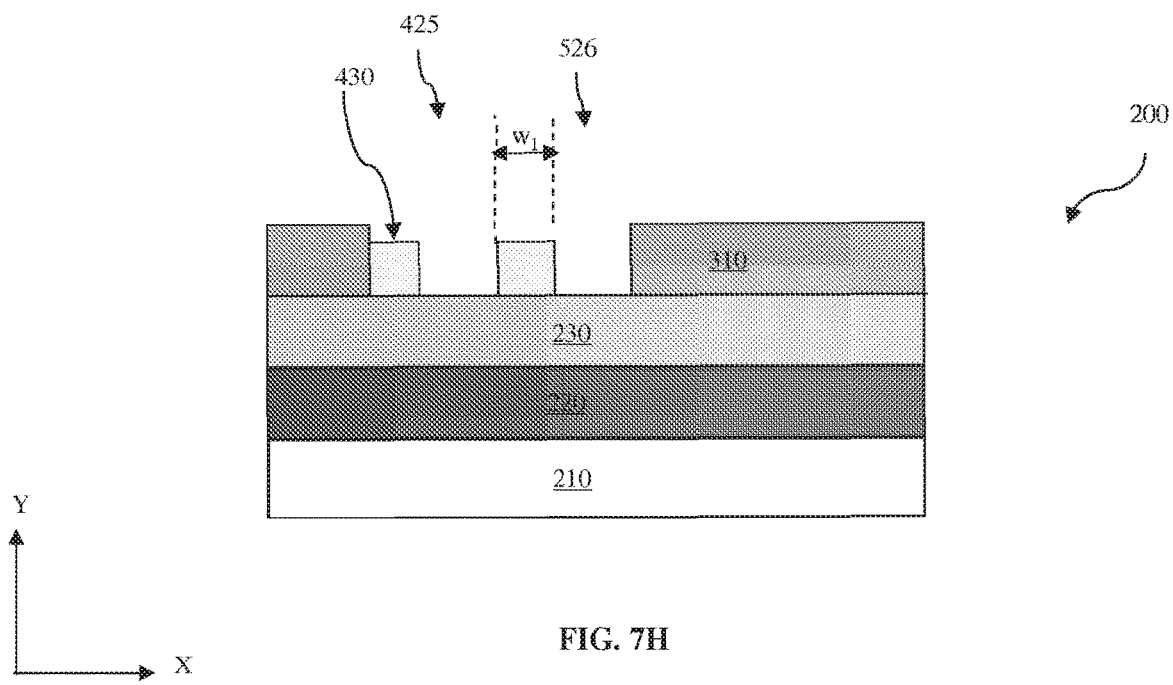

A resist strip process is then applied to remove any remaining second patterned resist layer 510. In conjunction with the process described above with respect to FIGS. 7A-7B, the first trench 425 having the first spacer 430 along its sidewalls and second trench 525 are formed in the first HM 310, as shown in FIGS. 7E-7F after the removal of the second patterned resist layer 510. Alternatively, in conjunction with the process described with respect to FIGS. 7C-7D, the first trench 425 having the first spacer 430 along its sidewalls and third trench 526 are formed in the first HM 310, as shown in the FIGS. 7G-7H after removal of the second patterned resist layer 510. Specifically, the first spacer 430 separates the first trench 425 away from the third trench 526 as shown in FIGS. 7G-7H. Therefore, the spacer 430 ensures a designed minimum space ($w_1$) between the first trench 425 and the third trench 526 and it is referred to as a first safeguarding-spacer.

Figure 8A:
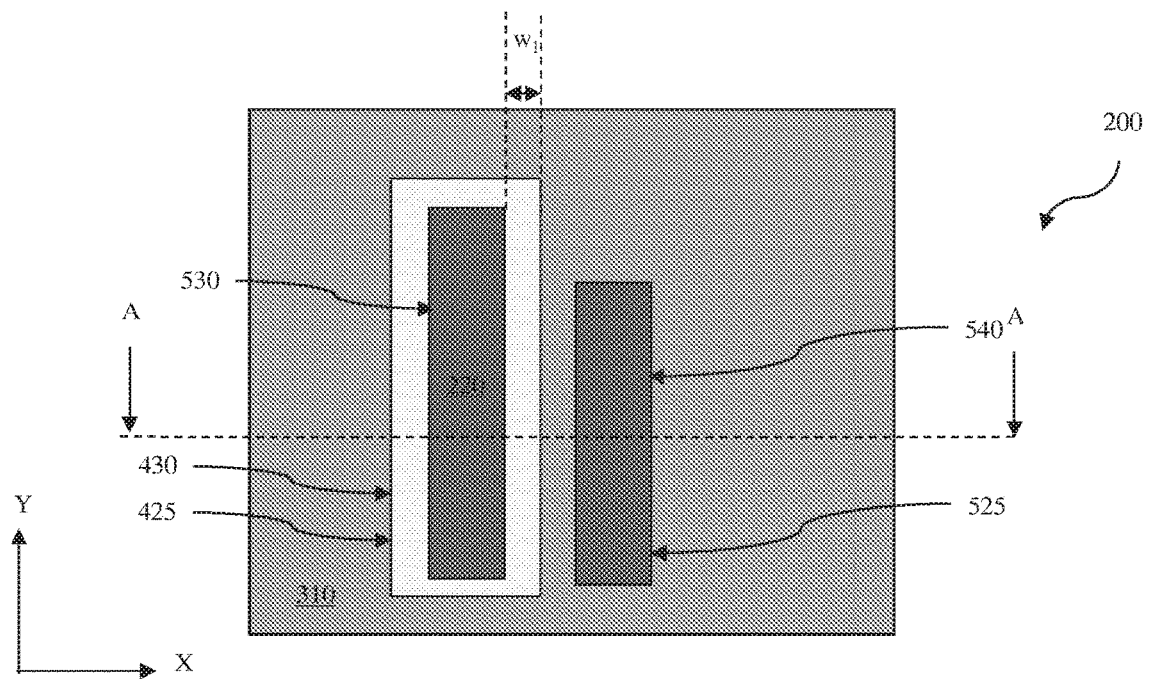
FIGS. 8A, 8C and 8E are top views of an example of a semiconductor device in accordance with some embodiments.
Figure 8B:
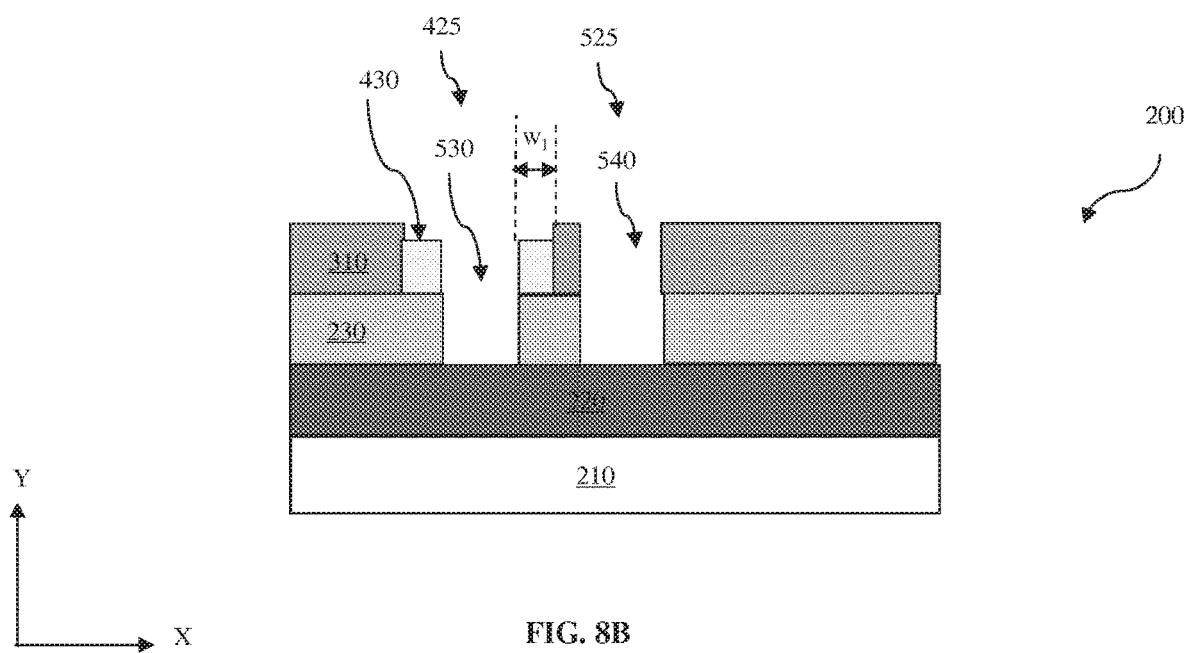
FIGS. 8B, 8D and 8F are cross-sectional views of an example semiconductor device in accordance with some embodiments, along the line A-A in FIGS. 8A, 8C and 8E, respectively.
Figure 8C:
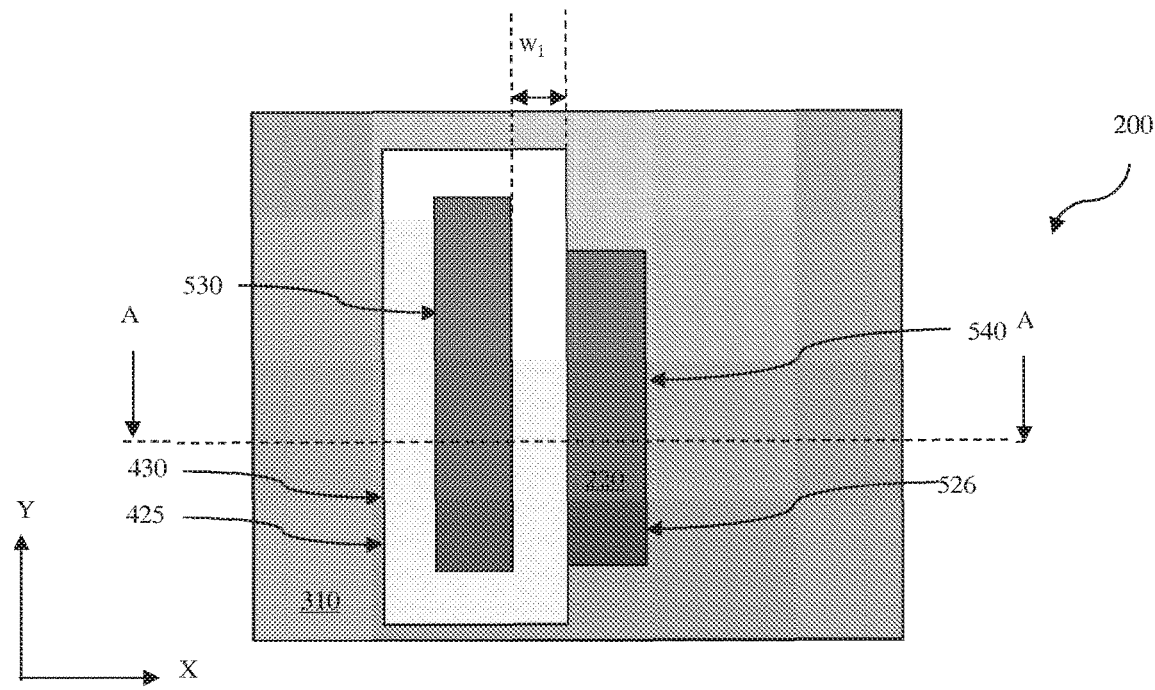
Figure 8D:
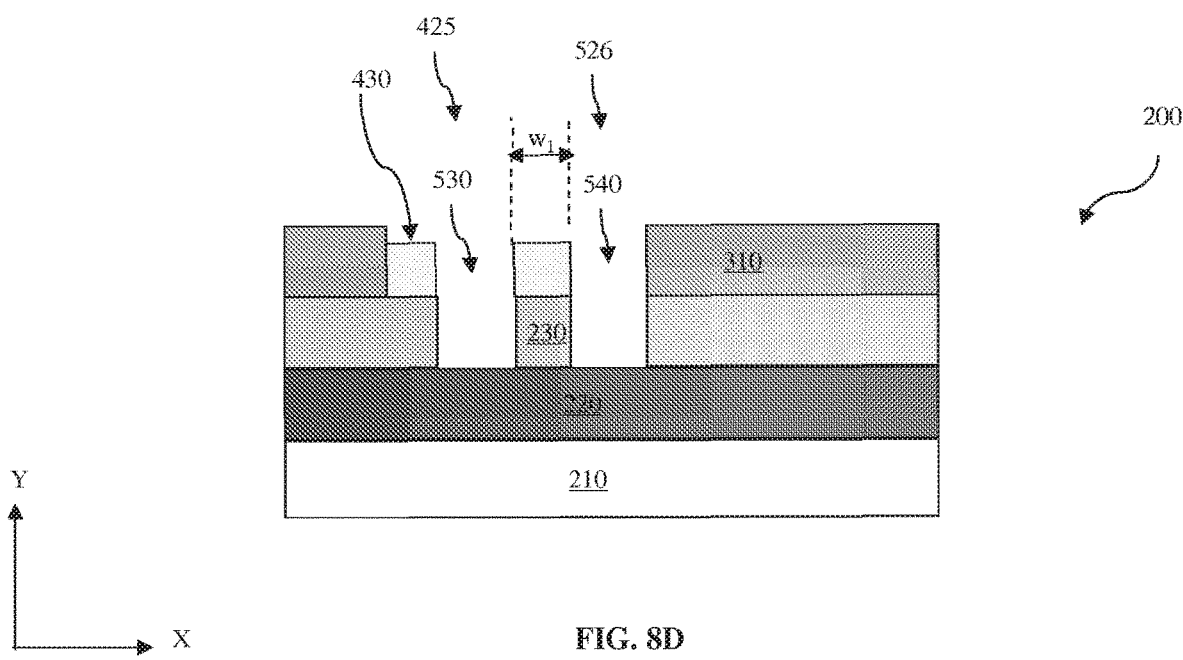
Figure 8E:
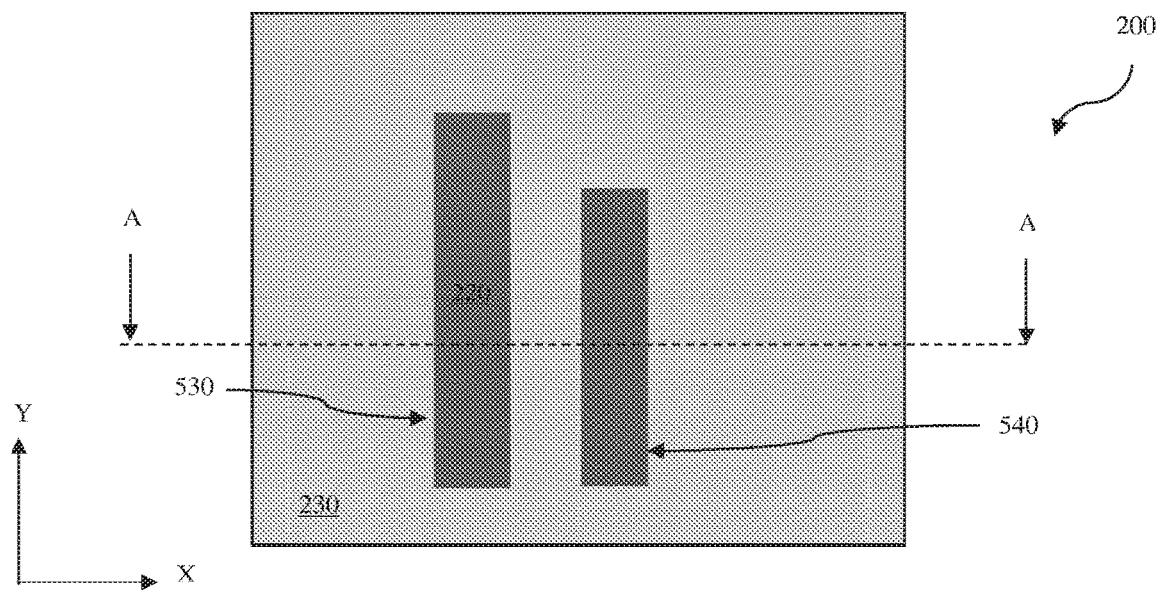
Figure 8F:
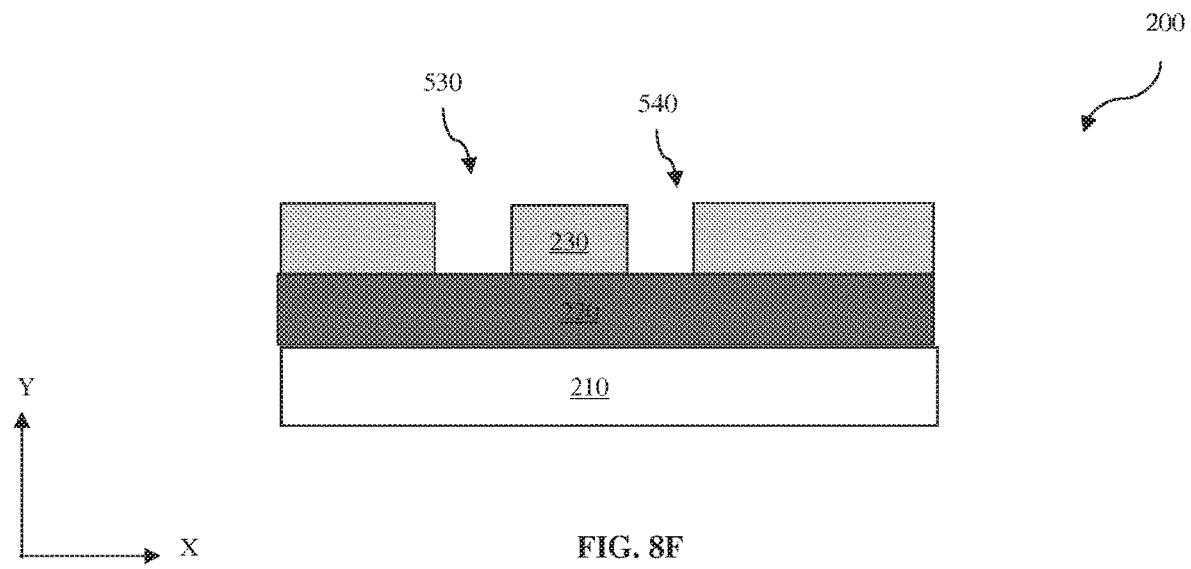

Referring to FIGS. 1 and 8A-8D, the method 100 proceeds to step 112 by etching the second material layer 230 through the first and second trenches, 425 and 525, (as shown in FIGS. 8A-8B), or through the first and third trenches, 425 and 526 (as shown in FIGS. 8C-8D in the alternative embodiment), to form a fourth trench 530 and a fifth trench 540 in the second material layer 230. In the present embodiment, the etch process is properly chosen to selectively etch the second material layer 230, but does not substantially etch the first HM 310 and the first spacer 430. Thus, the first HM 310 and the first spacer 430 serve as an etching-mask. Thereafter, the embodiments described in FIGS. 8A-8B and the embodiment described in FIGS. 8C-8D proceed to removing the first HM 310 and the first spacer 430 by other proper etching processes, as shown in FIGS. 8E and 8F.

Figure 9A:
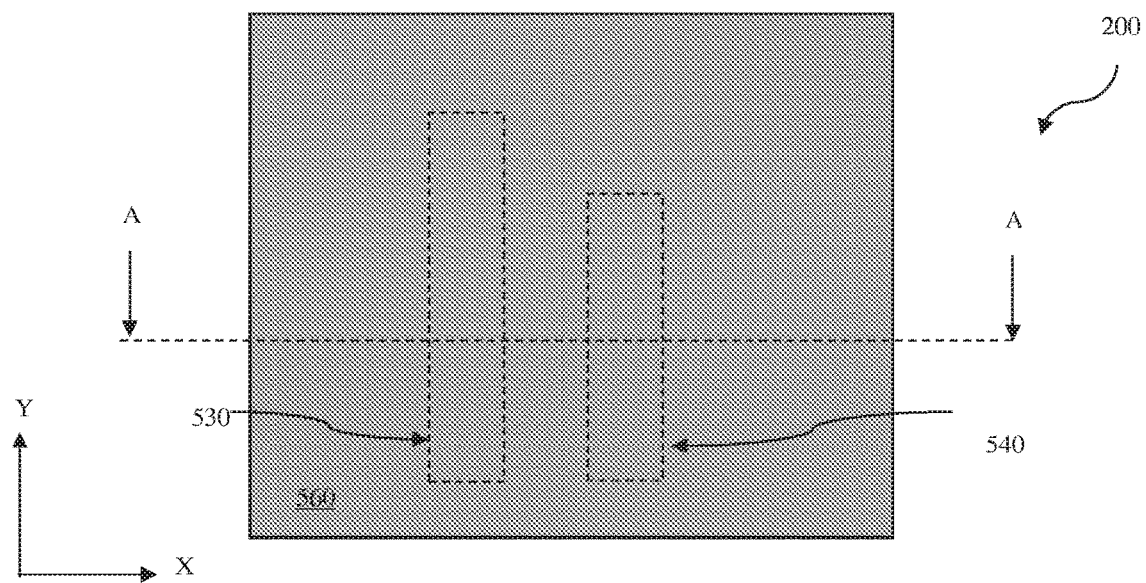
FIG. 9A is a top view of an example of a semiconductor device in accordance with some embodiments.
Figure 9B:
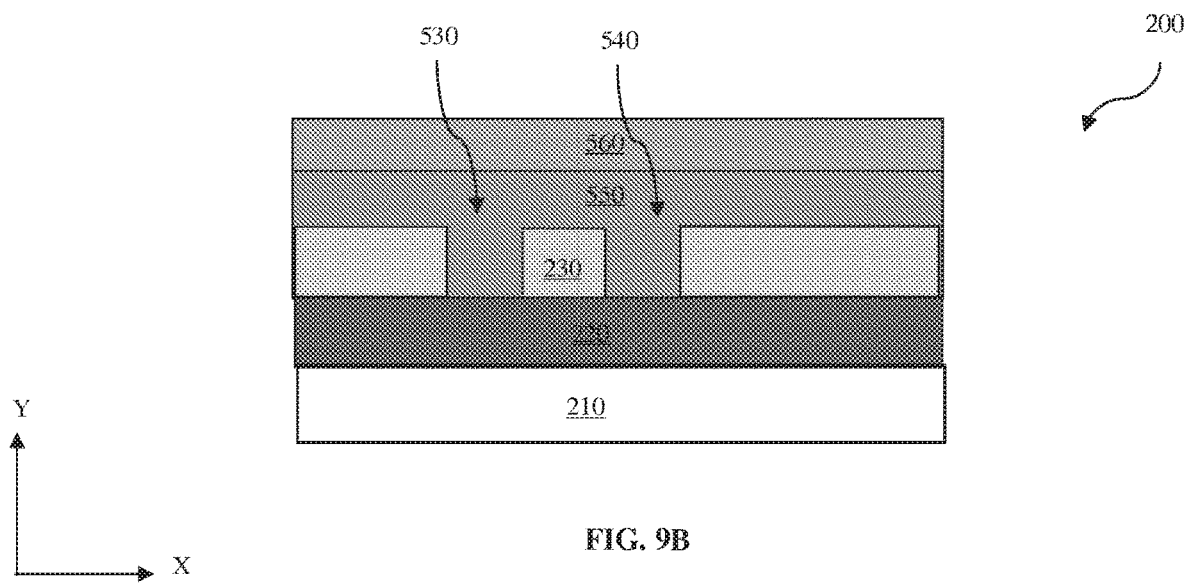
FIG. 9B is a cross-sectional view of an example semiconductor device in accordance with some embodiments, along the line A-A in FIG. 9A.

Referring to FIGS. 1 and 9A-9B, the method 100 then proceeds to step 114 by depositing a planarization layer 550 over the second material layer 230 and depositing a second HM 560 over the planarization layer 550. In the present embodiment, the planarization layer 550 is deposited over the second material layer 230, including filling in the third and fourth trenches, 530 and 540, to provide a planar top surface, which is desirable for subsequent lithography process. In some embodiment, a CMP is performed to further planarize the planarization layer 550. The planarization layer 550 may include spin-on glass, silicon oxide, silicon nitride, oxynitride, silicon carbide, low-k dielectric material, and/or other suitable materials. The second HM 560 may include silicon oxide, silicon nitride, oxynitride, silicon carbide, titanium oxide, titanium nitride, tantalum oxide, tantalum nitride, and/or any suitable materials. In the present embodiment, the second HM 560 may include a material which is different from the planarization layer 550 to achieve etching selectivity during subsequent etch processes. The second HM 560 carries a planar top surface from the planarization layer 550. The planarization layer 550 and the second HM 560 may be deposited by CVD, PVD, ALD, spin-on coating, or other suitable techniques.

Figure 10A:
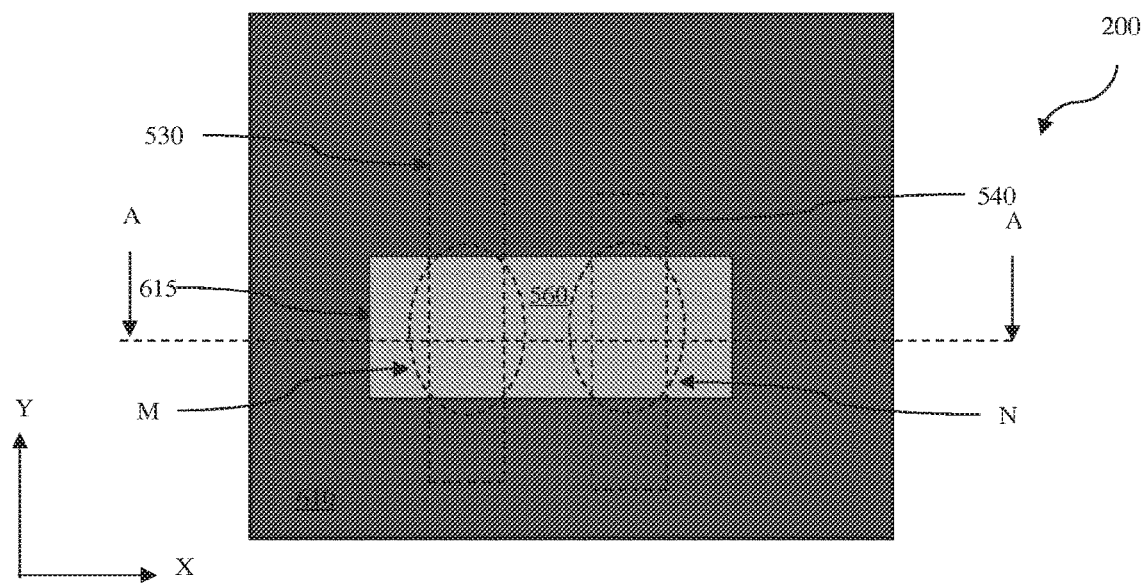
FIGS. 10A and 10C are top views of an example of a semiconductor device in accordance with some embodiments.
Figure 10B:
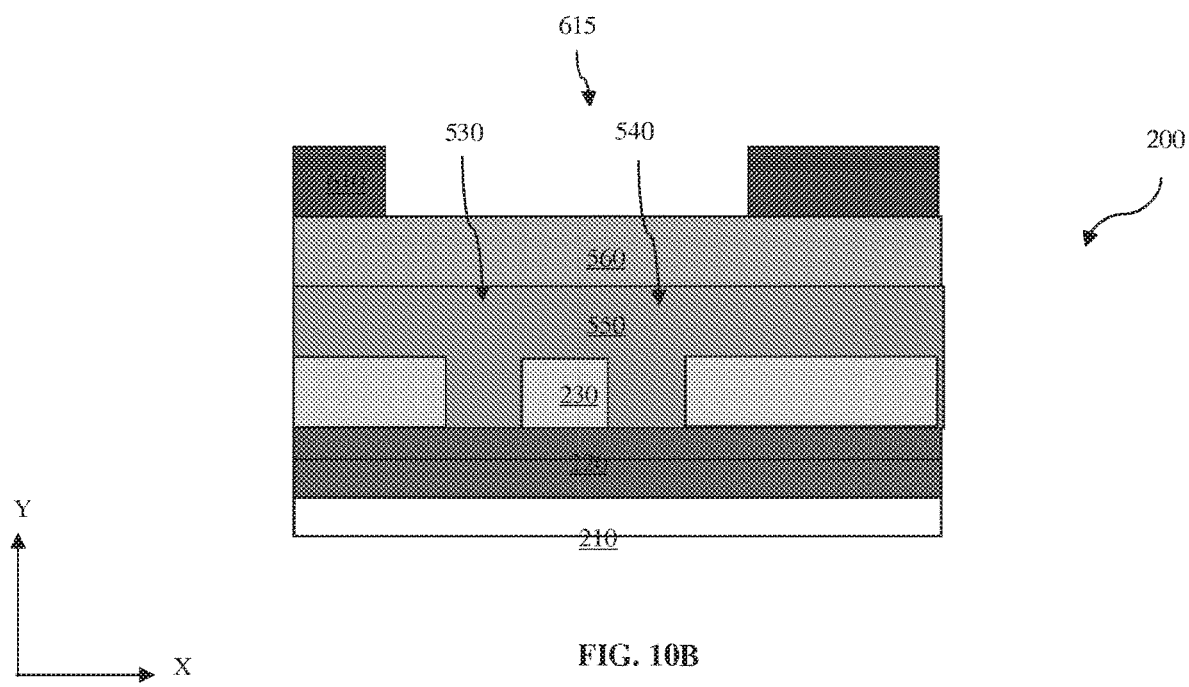
FIGS. 10B and 10D are cross-sectional views of an example semiconductor device in accordance with some embodiments, along the line A-A in FIGS. 10A and 10C, respectively.

Referring to FIGS. 1 and 10A-10B, the method 100 proceeds to step 116 by forming a third patterned resist layer 610 over the second HM 560. The second patterned resist layer 510 is formed similarly in many respects to the first patterned resist layer 410 discussed above association with FIGS. 4A-4B. The second patterned resist layer 610 has a third opening 615 extending along the X direction. By forming on a planar top surface of the second HM 560, uniformity of critical dimension and process window are improved. The third opening 615 overlaps and extends perpendicularly with respect to the third trench 530 at a first location M and the fourth trench 540 at a second location N. In some embodiments, the third opening 615 extends to outside of the third trench 530 at the first location M and outside of the fourth trench 540 at the second location N.

Figure 10C:
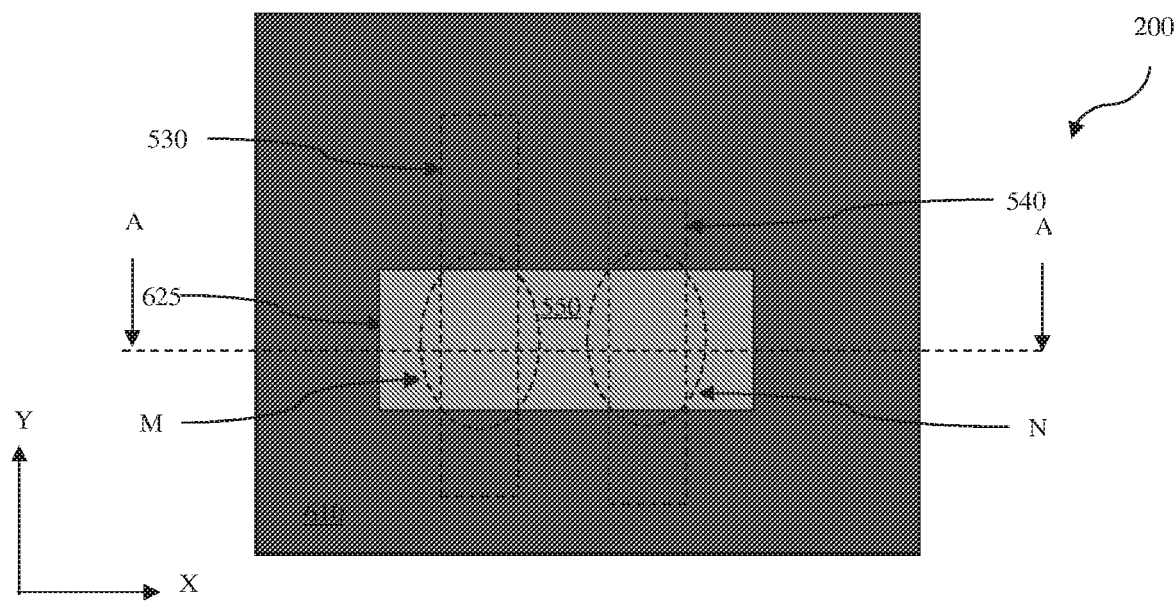
Figure 10D:
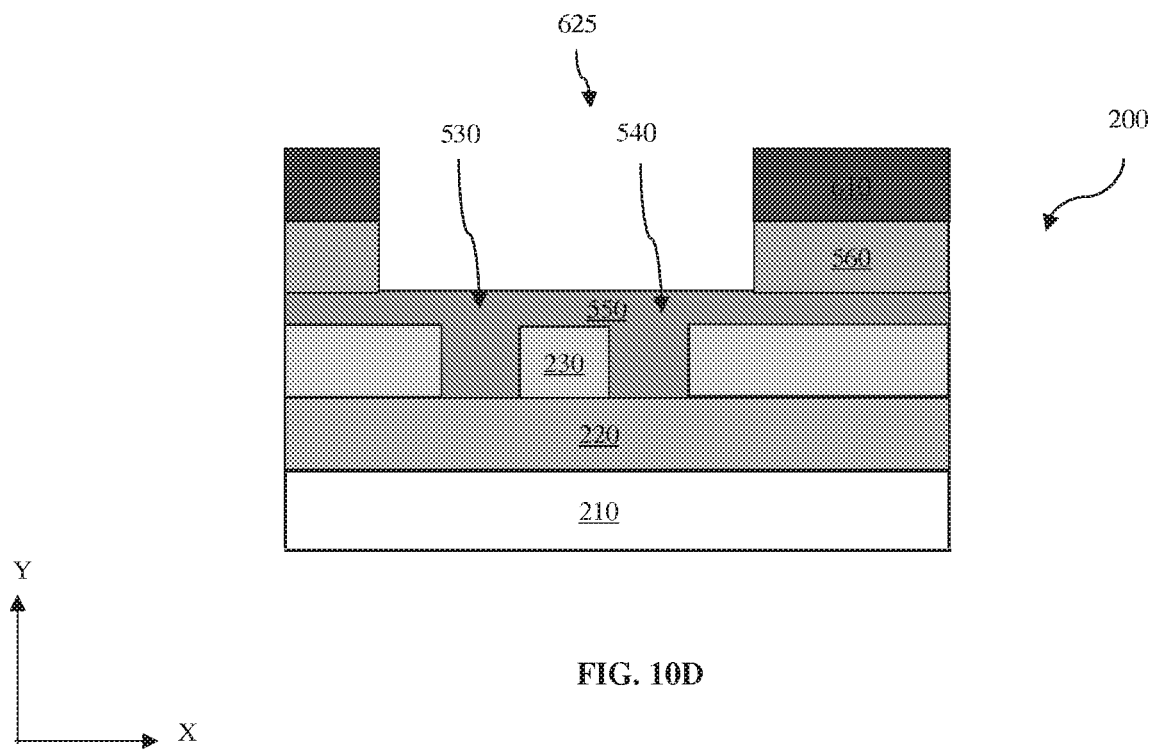

Referring to FIGS. 1 and 10C-10D, method 100 proceeds to step 118 by etching the second HM 560 through the third patterned resist layer 610 to form a sixth trench 625 in the second HM 560. The second HM 560 is etched similarly in many respects to the etching process first patterned discussed above association with FIGS. 4C-4D. The etch process is properly chosen to selectively remove the second HM 560 but does not substantially etch the planarization layer 550. A resist strip process is then applied to remove any remaining third patterned resist layer 610.

Figure 11A:
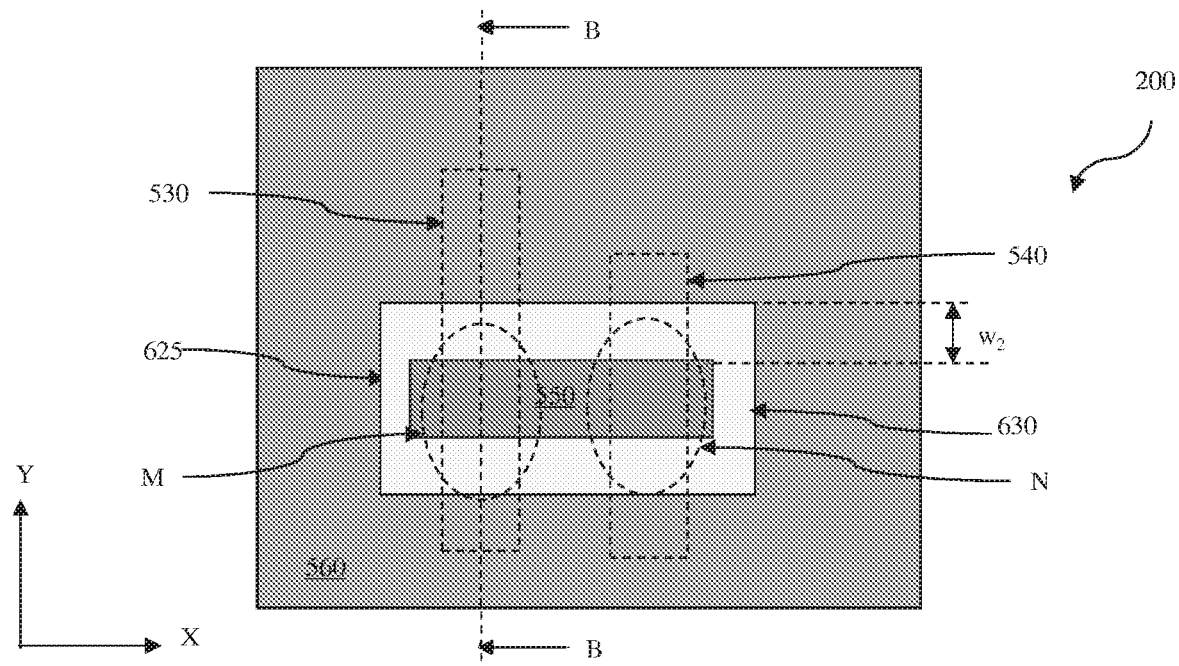
FIG. 11A is a top view of an example of a semiconductor device in accordance with some embodiments.
Figure 11B:
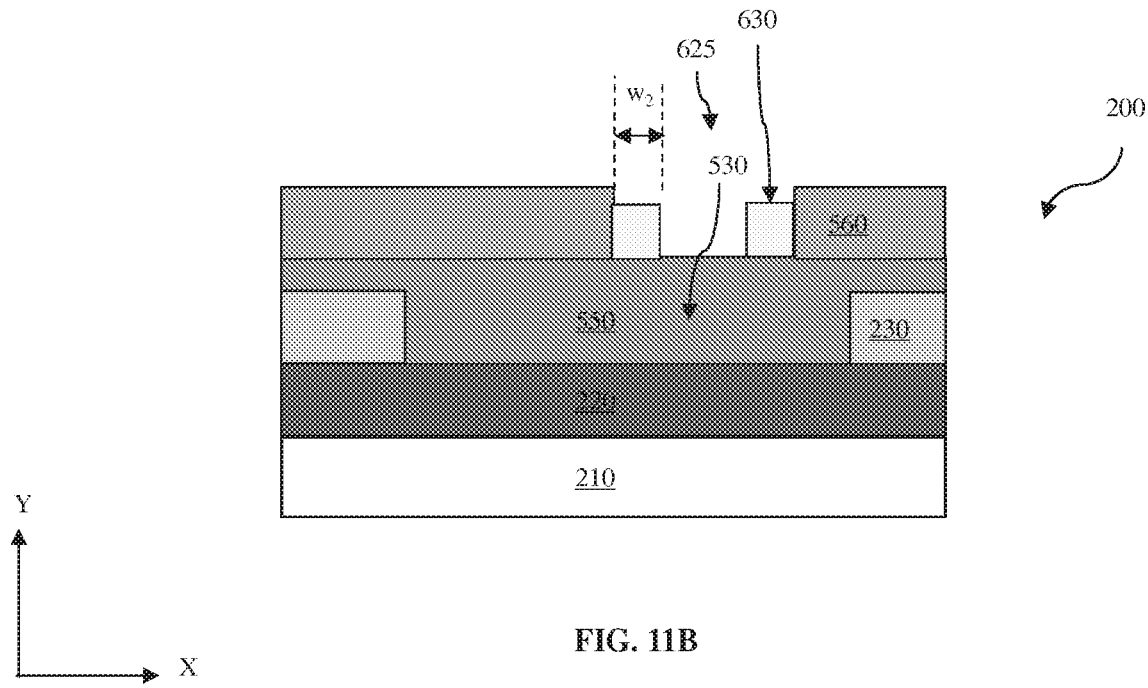
FIG. 11B is a cross-sectional view of an example semiconductor device in accordance with some embodiments, along the line A-A in FIG. 11A.

Referring to FIGS. 1 and 11A-11B, the method 100 proceeds to step 120 by forming second spacers 630 along sidewalls of the sixth trench 625. In the present embodiment, the second spacers 630 include a material which is different from the second HM 560 to achieve etching selectivity subsequent etch. The second spacers 630 are formed similarly in many respects to the etching process first patterned discussed above association with FIGS. 5A-5B. The second spacer 630 has a second width $w_2$.

Figure 12A:
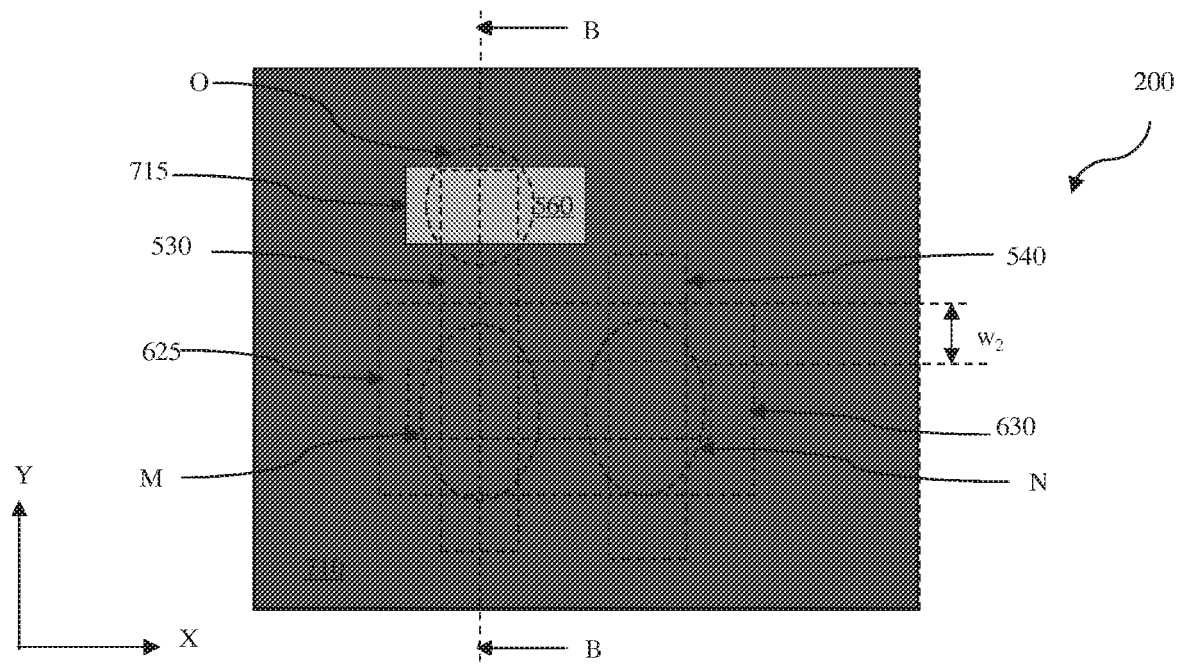
FIGS. 12A and 12C are top views of an example of a semiconductor device in accordance with some embodiments.
Figure 12B:
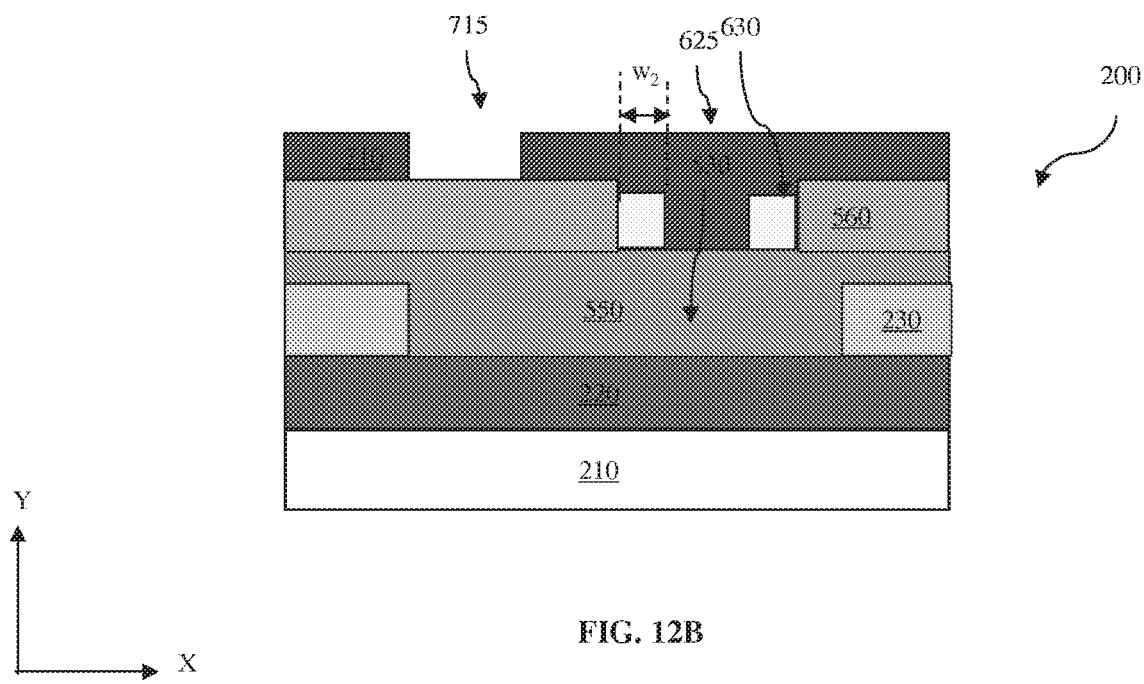
FIGS. 12B and 12D are cross-sectional views of an example semiconductor device in accordance with some embodiments, along the line B-B in FIGS. 12A and 12C, respectively.

Referring to FIGS. 1 and 12A-12B, the method 100 proceeds to step 122 by forming a fourth patterned resist layer 710 over the second HM 560. The fourth patterned resist layer 710 is formed similarly in many respects to the first patterned resist layer 410 discussed above association with FIGS. 4A-4B. The fourth patterned resist layer 710 has a fourth opening 715, which extends along the X direction. The fourth opening 715 is parallel to the sixth trench 625. In some embodiments, the fourth opening 715 overlaps with the fourth trench 530 at a third location O (an end of the fourth trench 530). A portion of the second HM 560 is exposed within the fourth opening 715.

In the present embodiment, the fourth opening 715 is defined by the fourth patterned resist layer 710 while the third opening 615 is defined by the third patterned resist layer 610. Thus, line end shortening distortions induced by threshold distance $d_{th}$ constrain in the lithography exposing process are greatly reduced. The third and fourth openings, 615 and 715, are formed with regular contours (such as rectangular contours) at their opening ends.

Figure 12C:
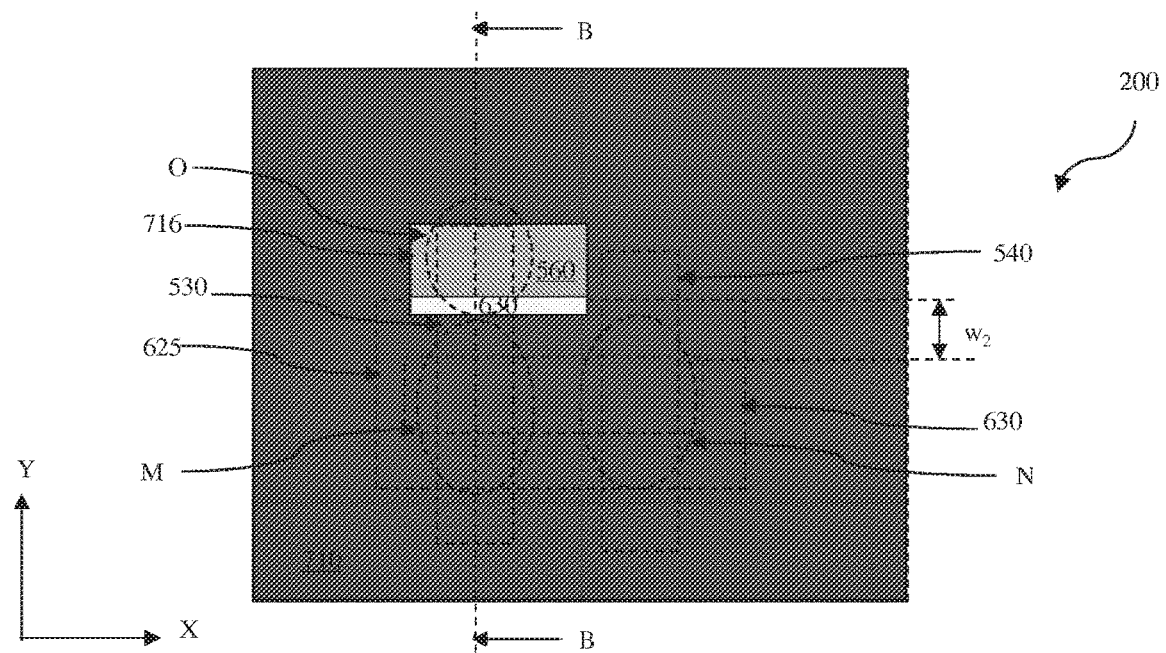
Figure 12D:
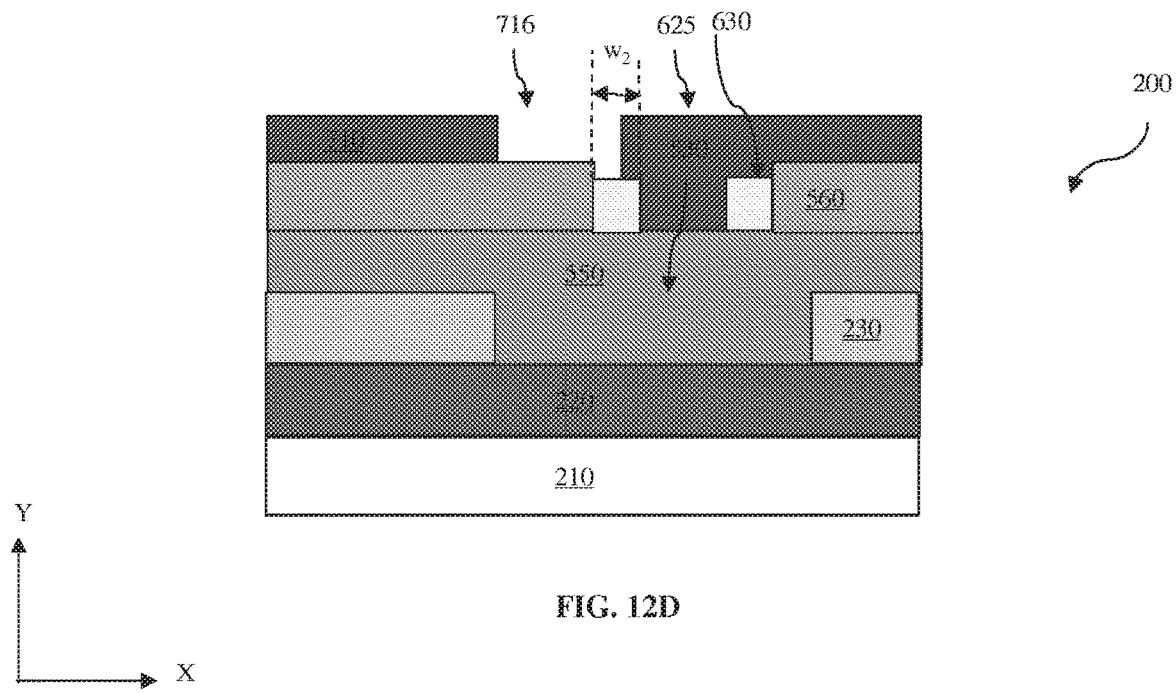

In some embodiments, referring to FIGS. 12C-12D, the fourth opening is positioned closer to the sixth trench 625. Thus, in some embodiments the second HM 560 and a portion of the adjacent second spacer 630 is exposed within the fourth opening (referred to as 716 as shown in FIGS. 12C-12D). Sometimes the exposure of the adjacent second spacer 630 is caused by adverse process impacts, such as misalignment, pattern irregularities/distortions in the lithography process of forming the fourth patterned resist layer 710. In still other embodiments, the fourth opening 716 has a larger width such that it extends to the adjacent second spacer 630 to obtain advantages, such as relaxing lithography process resolution constrains.

Figure 13A:
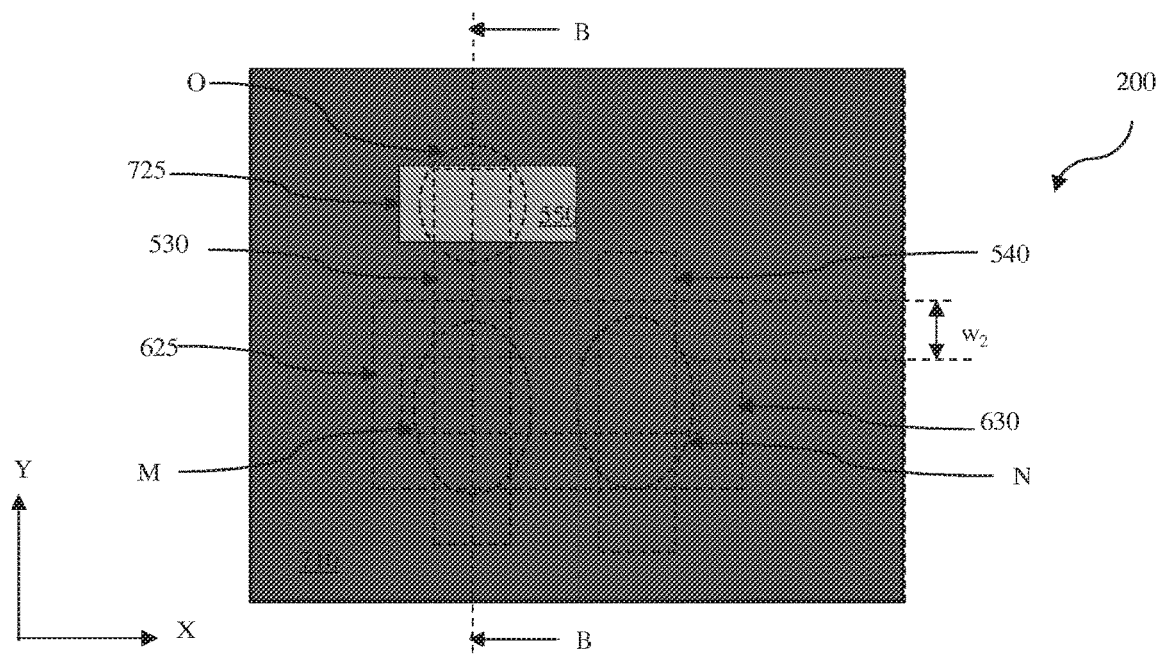
FIGS. 13A and 13C are top views of an example of a semiconductor device in accordance with some embodiments.
Figure 13B:
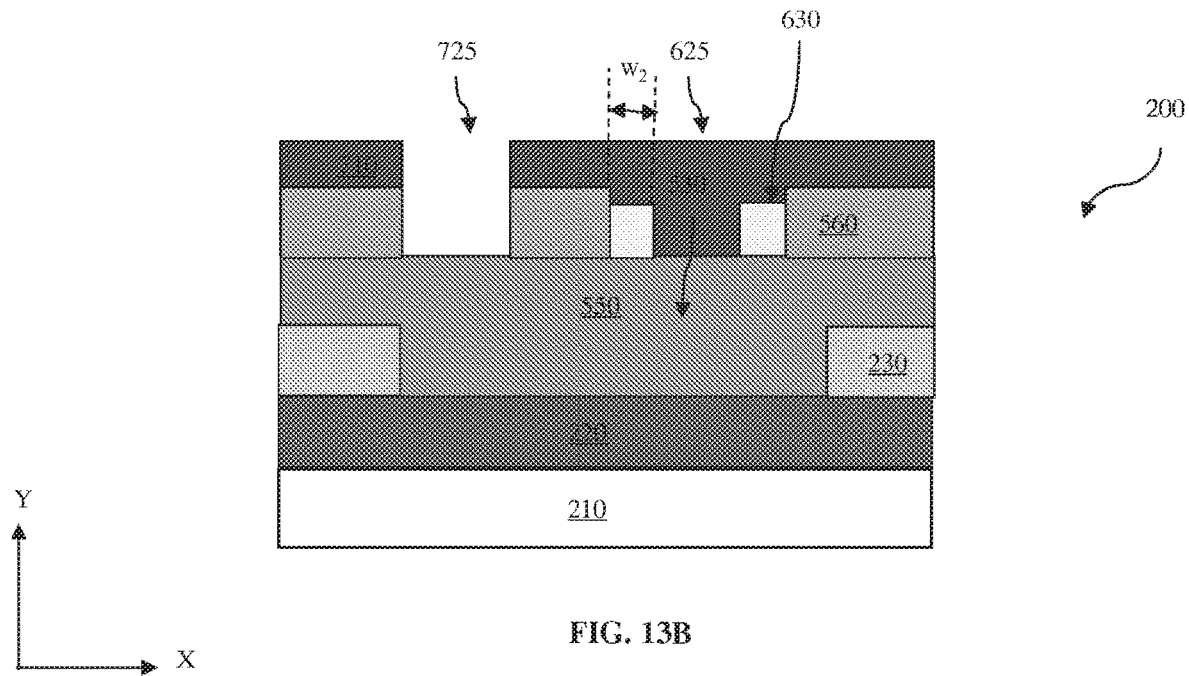
FIGS. 13B and 13D are cross-sectional views of an example semiconductor device in accordance with some embodiments, along the line B-B in FIGS. 13A and 13C, respectively.

Referring to FIGS. 1 and 13A-13B (in conjunction with the process described with respect to FIGS. 12A-12B), method 100 proceeds to step 124 by etching the second HM 560 through the fourth opening 715 to form a seventh trench 725 in the second HM 560. A portion of the second material layer 230 is exposed in the seventh trench 725. The etch process may include wet etch, dry etch, or a combination thereof.

Figure 13C:
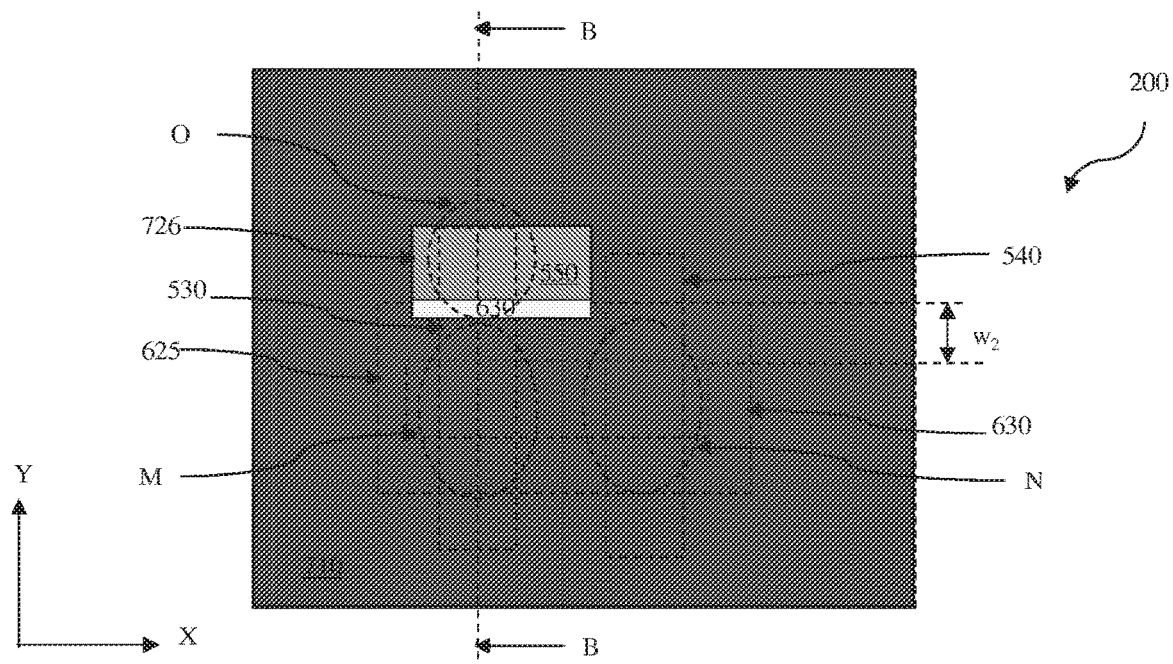
Figure 13D:
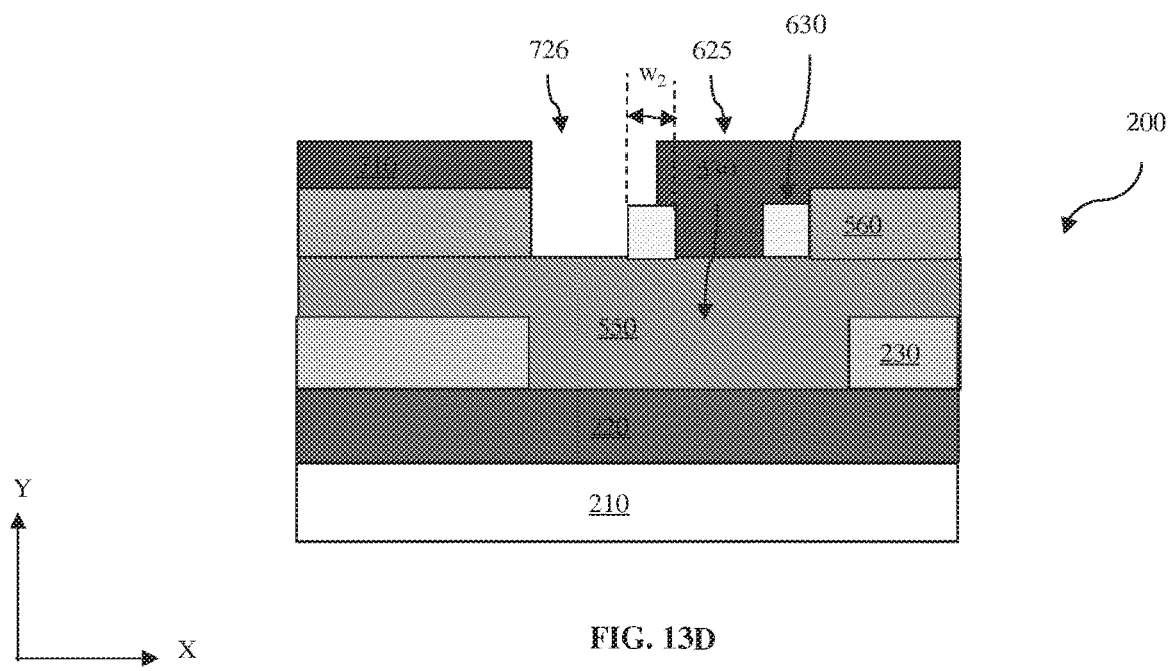

As discussed above in reference to FIGS. 12C-12D, in some embodiments the fourth opening is positioned closer to the sixth trench 625 such that the second HM 560 and a portion of the adjacent second spacer 630 is exposed within the fourth opening (referred to as 716 as shown in FIGS. 12C-12D). In such a scenario, the etch process is properly chosen to selectively etch the second HM 560 without substantially etching the second spacer 630. Thus, the portion of the adjacent second spacer 630 exposed within the fourth opening 716 serves as a sub-etch-mask (or guars the sixth trench 625) during etching the second HM 560 through the fourth opening 716 to form an eighth trench 726 as shown in FIGS. 13C-13D in this alternative embodiment.

Figure 13H:
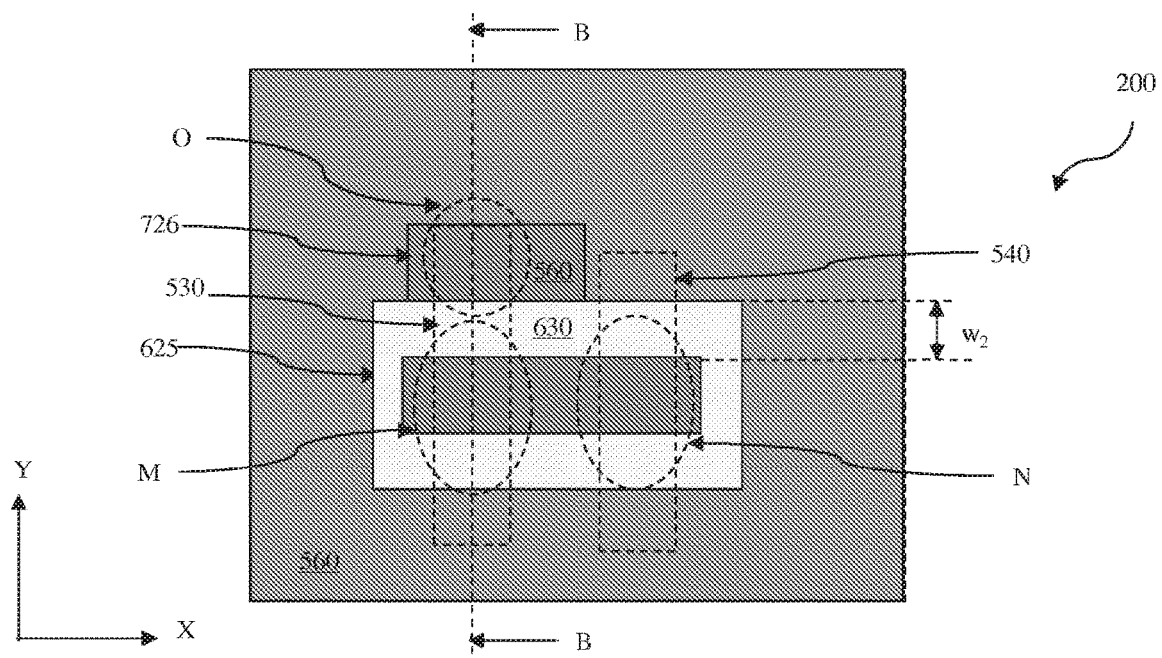
FIG. 13H is a top view of an example of a semiconductor device in accordance with some embodiments.
Figure 13I:
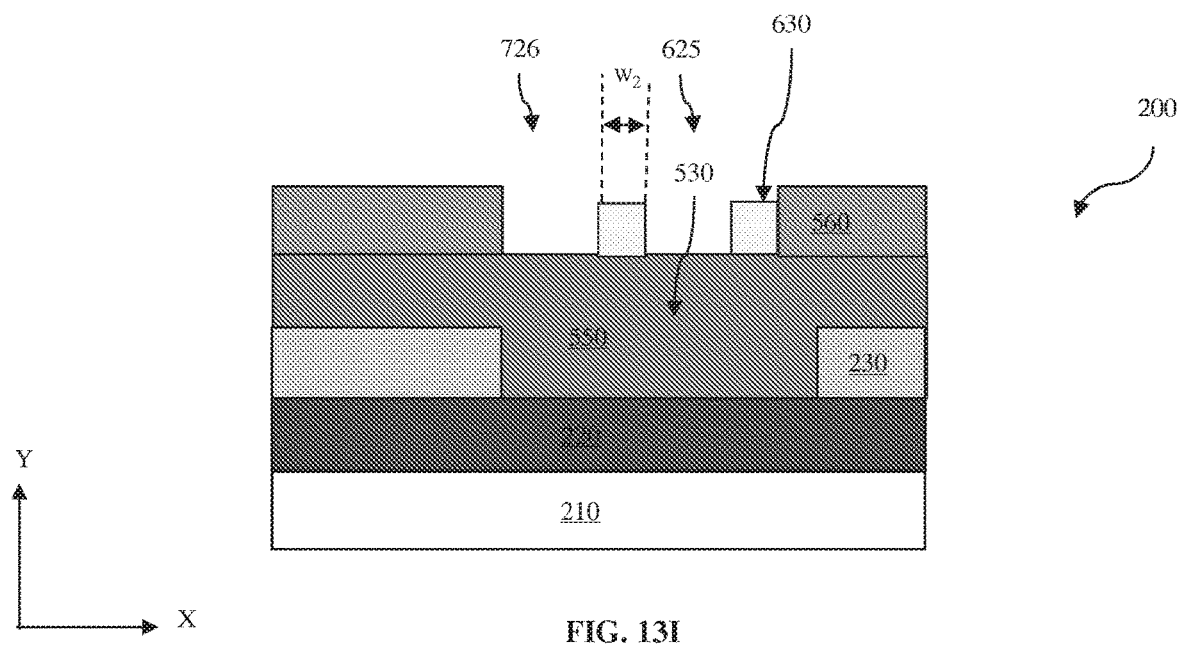
FIG. 13I is a cross-sectional view of an example semiconductor device in accordance with some embodiments, along the line B-B in FIG. 13H.

A resist strip process is then applied to remove any remaining fourth patterned resist layer 710. In conjunction with the process described above with respect to FIGS. 13A-13B, the sixth trench 625 having the second spacer 630 along its sidewalls and the seventh trench 725 are formed in the second HM 560, as shown in FIGS. 13E-13G after the removal of the fourth patterned resist layer 710. Alternatively, in conjunction with the process described with respect to FIGS. 13C-13D, the sixth trench 625 having the second spacer 560 along its sidewalls and eighth trench 726 are formed in the second HM 560, as shown in the FIGS. 13H-13I after the removal of the fourth patterned resist layer 710. Specifically, the second spacer 560 separates the sixth trench 625 away from the eighth trench 726 as shown in FIGS. 13H-13I. Therefore the second spacer 560 ensures a designed minimum space ($w_2$) between the sixth trench 625 and the eighth trench 726 and it is referred to as a second safeguarding-spacer.

Figure 14A:
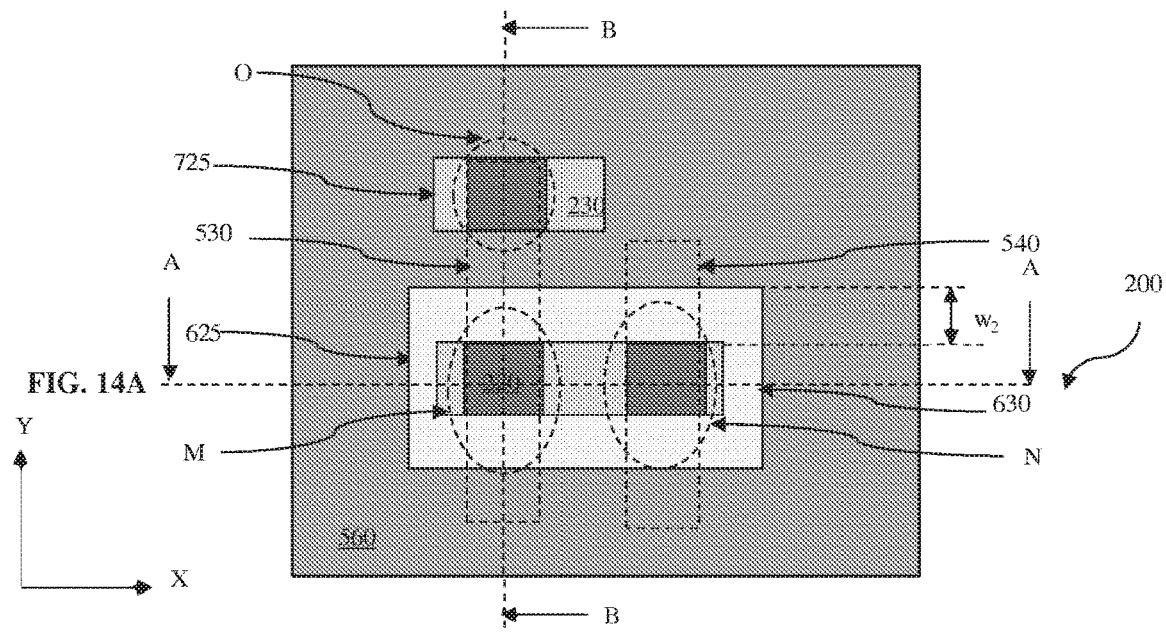
FIG. 14A is a top view of an example of a semiconductor device in accordance with some embodiments.
Figure 14B:
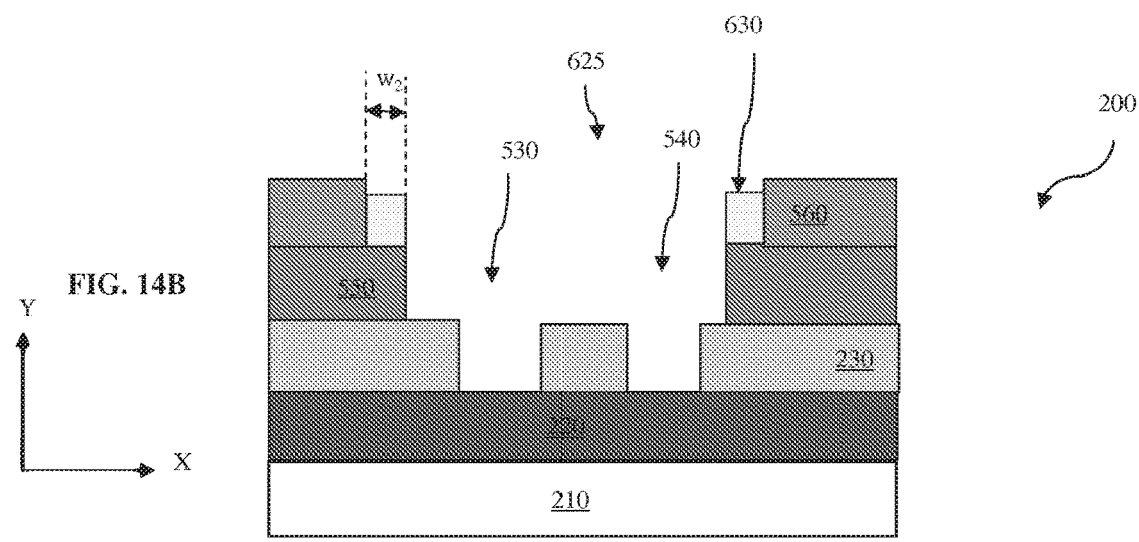
FIG. 14B is a cross-sectional view of an example semiconductor device in accordance with some embodiments, along the line A-A in FIG. 14A.
Figure 14C:
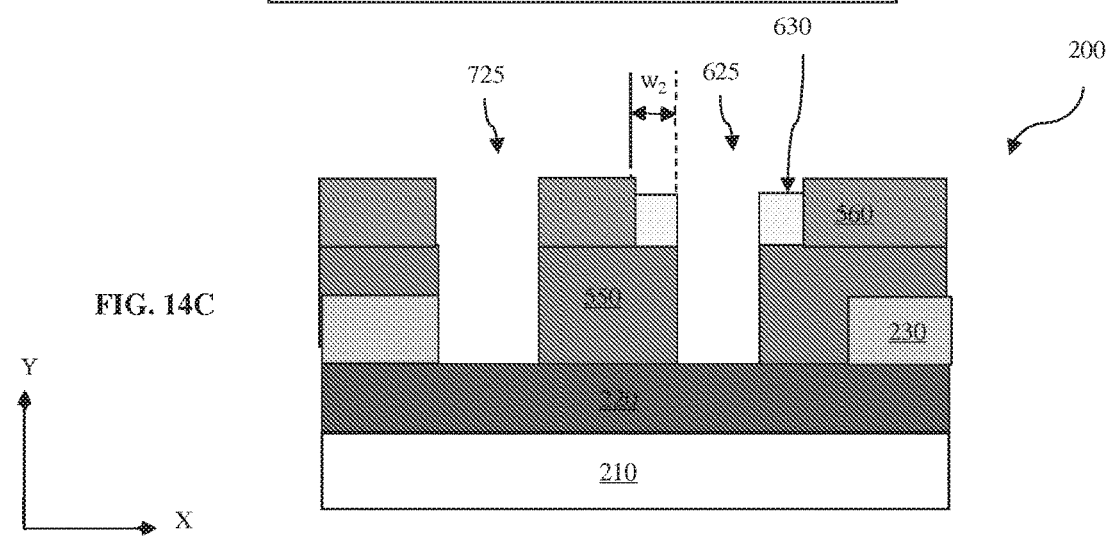
FIG. 14C is a cross-sectional view of an example semiconductor device in accordance with some embodiments, along the line B-B in FIG. 14A.
Figure 14D:
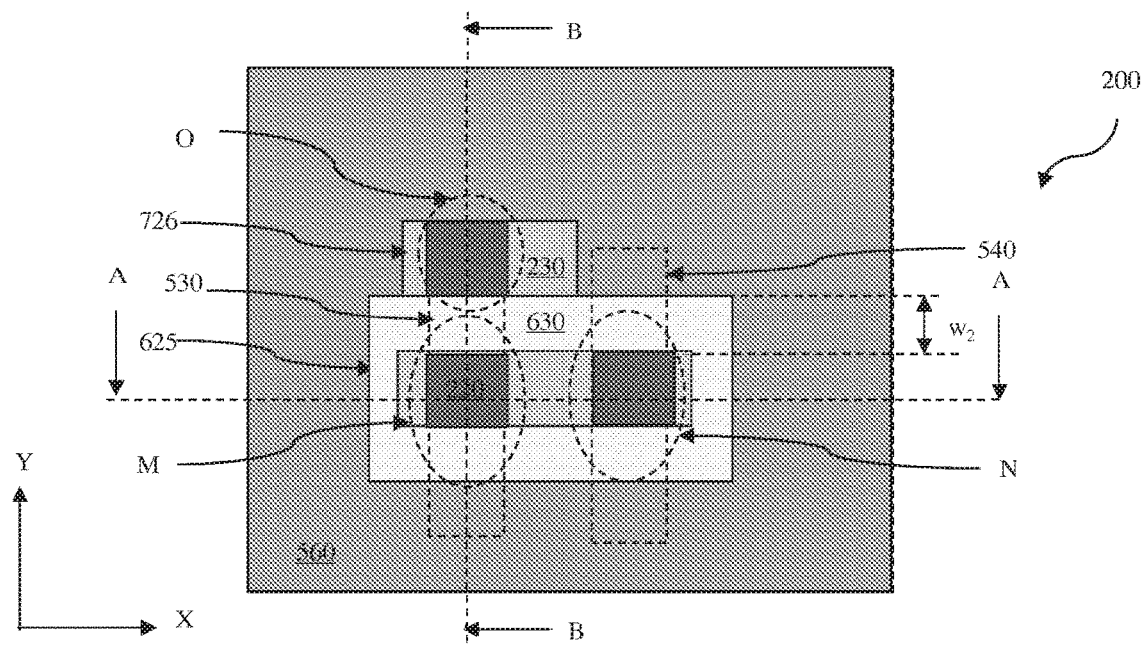
FIG. 14D is a top view of an example of a semiconductor device in accordance with some embodiments.
Figure 14E:
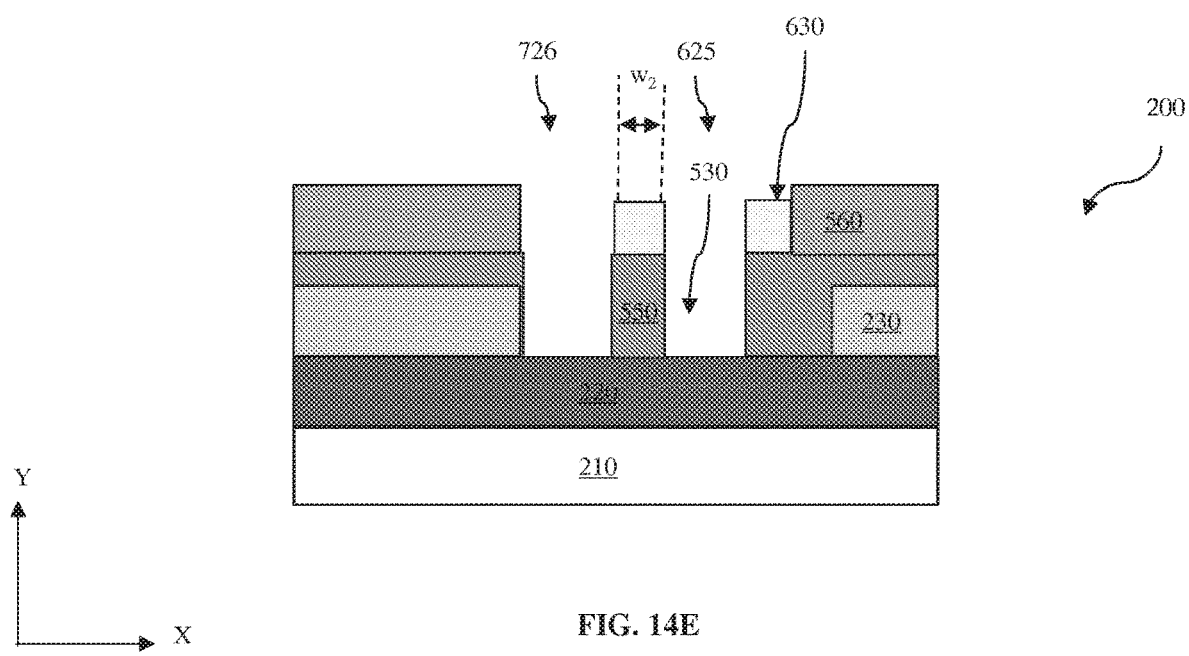
FIG. 14E is a cross-sectional view of an example semiconductor device in accordance with some embodiments, along the line B-B in FIG. 14D.
Figure 14F:
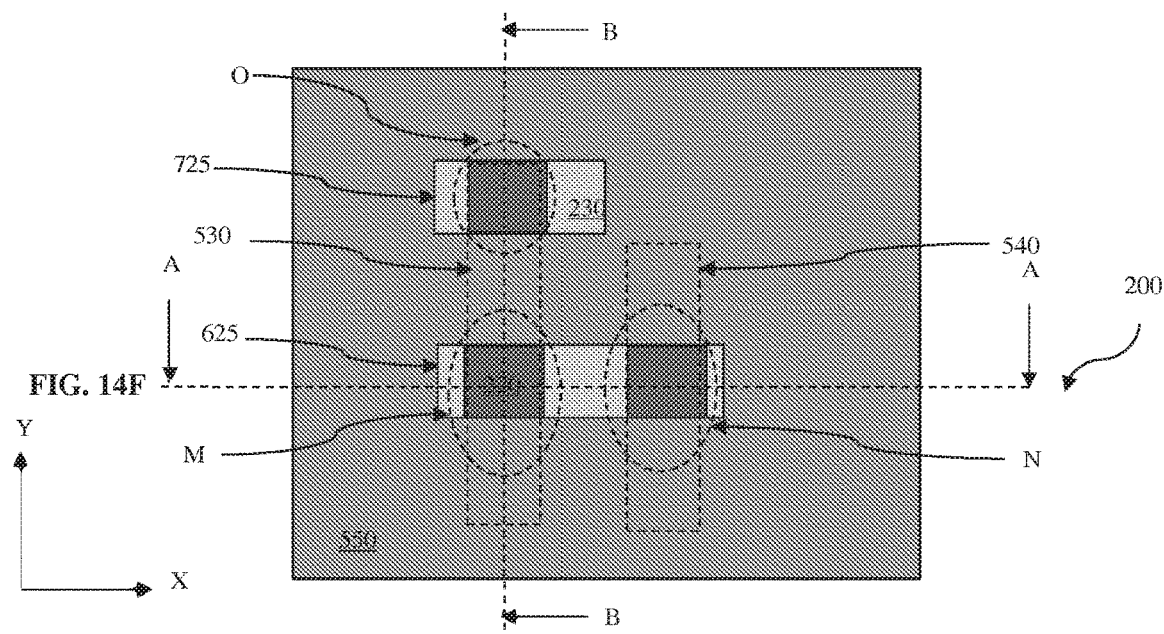
FIG. 14F is a top view of an example of a semiconductor device in accordance with some embodiments.
Figure 14G:
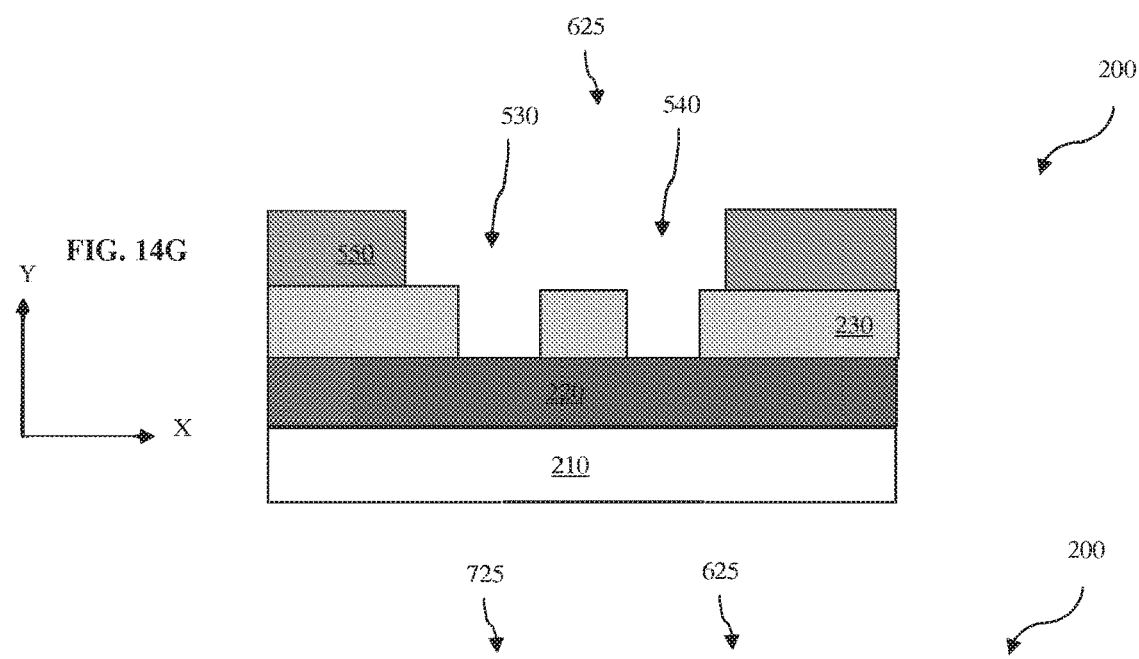
FIG. 14G is a cross-sectional view of an example semiconductor device in accordance with some embodiments, along the line A-A in FIG. 14F.
Figure 14H:
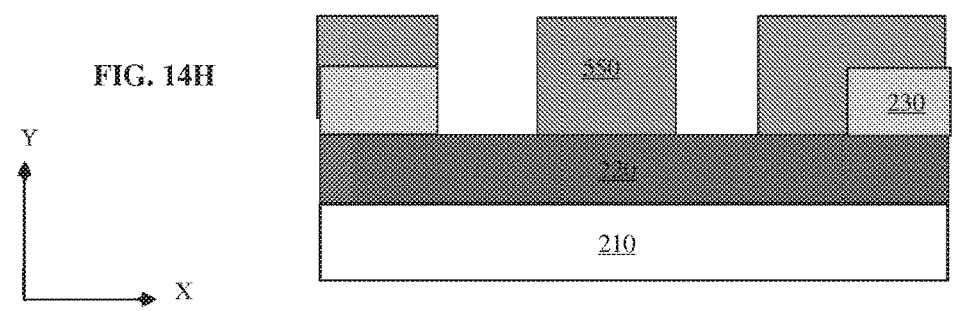
FIG. 14H is a cross-sectional view of an example semiconductor device in accordance with some embodiments, along the line B-B in FIG. 14F.
Figure 14I:
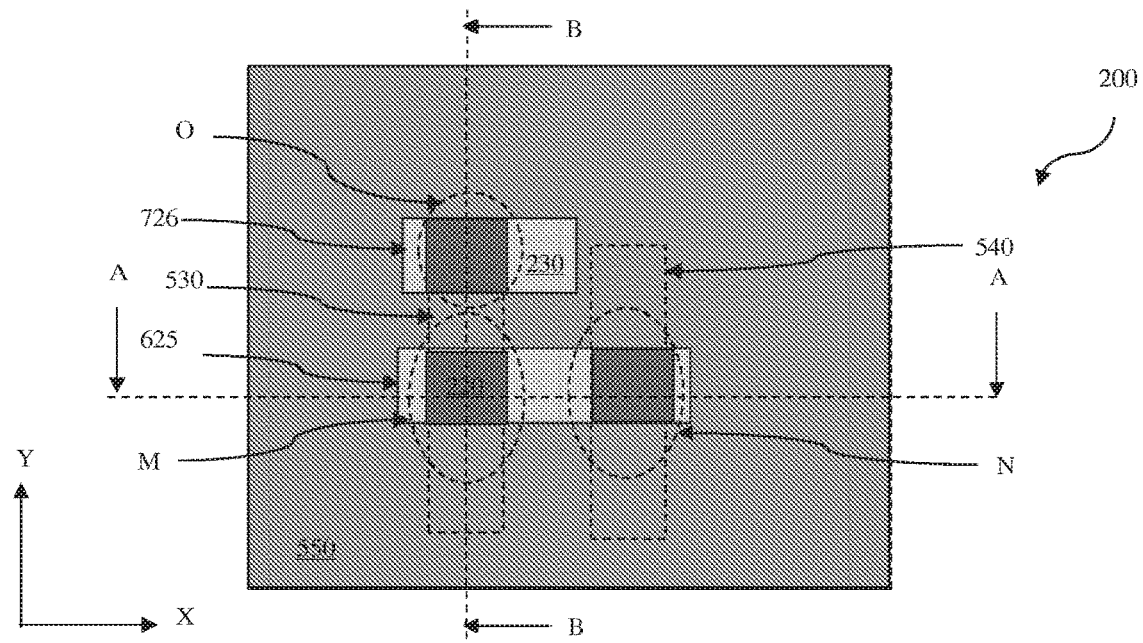
FIG. 14I is a top view of an example of a semiconductor device in accordance with some embodiments.
Figure 14J:
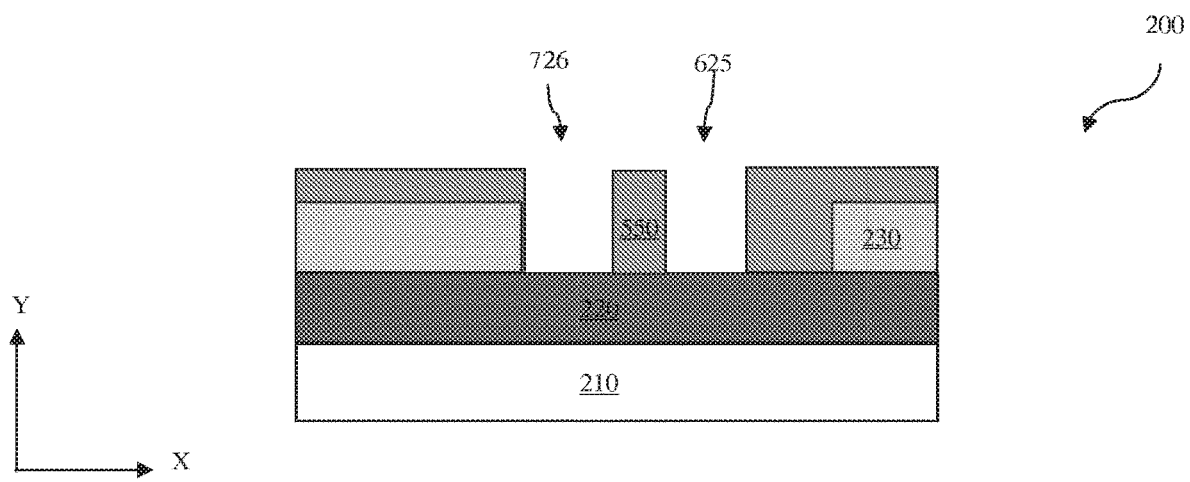
FIG. 14J is a cross-sectional view of an example semiconductor device in accordance with some embodiments, along the line B-B in FIG. 14J.
Figure 15A:
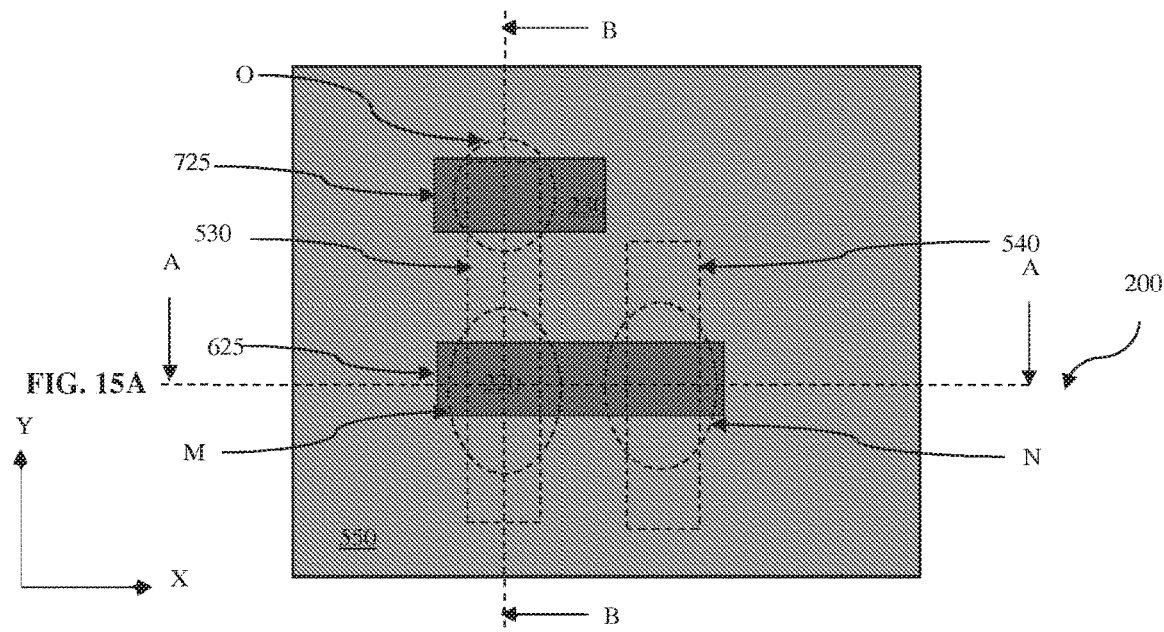
FIG. 15A is a top view of an example of a semiconductor device in accordance with some embodiments.
Figure 15B:
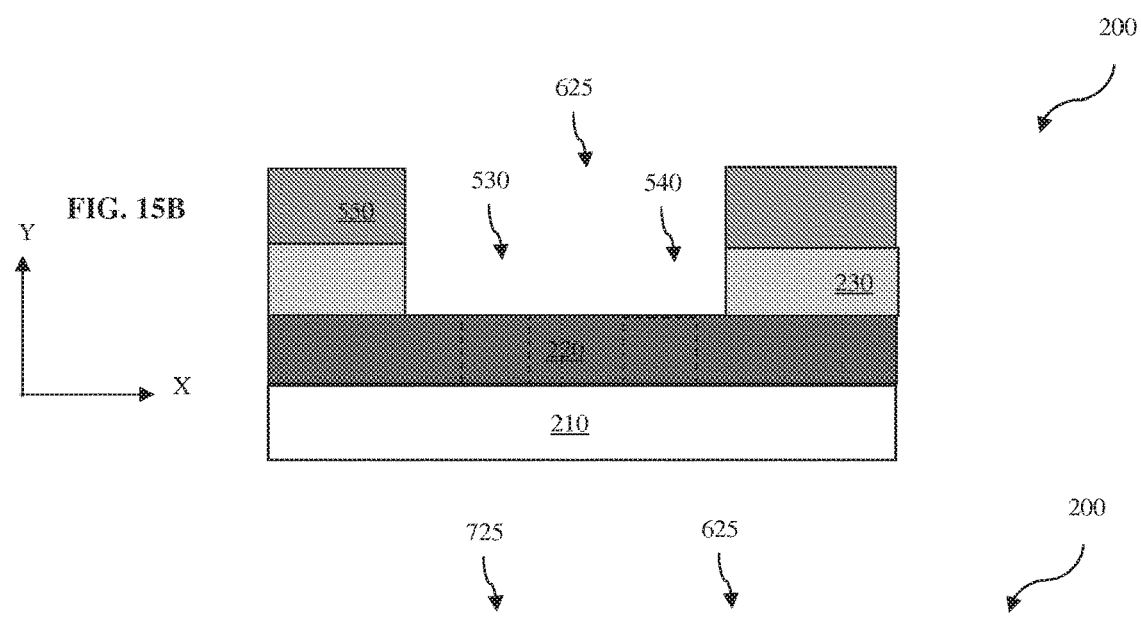
FIG. 15B is a cross-sectional view of an example semiconductor device in accordance with some embodiments, along the line A-A in FIG. 15A.
Figure 15C:
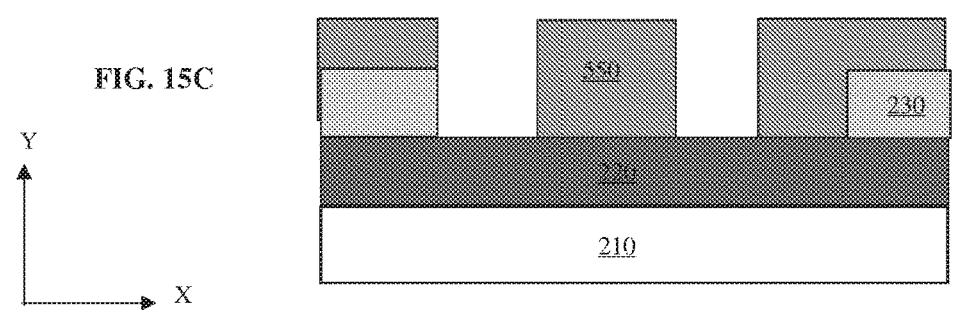
FIG. 15C is a cross-sectional view of an example semiconductor device in accordance with some embodiments, along the line B-B in FIG. 15A.

Referring to FIGS. 1 and 14A-14E, the method 100 proceeds to step 126 by etching the planarization layer 550 through the sixth and seventh trenches, 625 and 725 to extend the sixth and seventh trenches, 625 and 725 to the planarization layer 550 (as shown in FIGS. 14A-14C), or through the sixth and eighth trenches, 625 and 726 to extend the sixth and eighth trenches, 625 and 727 to the planarization layer 550 (as shown in FIGS. 14D-14E in the alternative embodiment). In the present embodiment, the etch process is properly chosen to selectively etch the planarization layer 550, but does not substantially etch the second HM 560, the second spacer 630 and the second material layer 230. Thus, the second HM 560 and the second spacer 630 serve as an etching-mask.

Thereafter, the embodiments described in FIGS. 14A-14C and the embodiment described in FIGS. 14D-14E proceed to removing the second HM 560 and the second spacer 630 by other proper etching processes, as shown in FIGS. 14F-14J. The planarization layer 550 carries the sixth and seventh (or eighth) trenches, 625 and 725 (or 726), and portions of the second material layers 230 are exposed within the sixth and seventh/or eighth trenches, 625 and 725 (or 726).

Referring to FIGS. 1 and 15A-15C, the method 100 proceeds to step 128 by removing the second material layer 230 within the sixth and seventh (or eighth) trenches, 625 and 727 (or 726). In the present embodiment, the etch process is properly chosen to selectively etch the second material layer 230, but does not substantially etch the planarization layer 550 and the first material layer 220. Thus, the planarization 550 serve as an etching-mask and the first material layer 220 serves as an etch-stop layer. The planarization layer 550 is then removed by other proper etching processes, as shown in FIGS. 15D and 15E.

Referring again to FIGS. 15D-15E, thus the second material layer 230 has the fourth, fifth, sixth and seventh (or eighth) trenches, 530, 540, 625 and 725 (or 726), such that the fourth and fifth trenches are parallel to each other, along the Y direction and the sixth and seventh (or eighth) trenches are parallel to each other, along the X direction. The fourth trench 530 connects to the seventh trench 725 at the location O with a first connecting angle θ to form a L-shape trench 810, the sixth trench 625 connects to the fourth trench 530 at location M with a second connecting angle α and the sixth trench 625 connects to the fifth trench 540 at locations N with a third connecting angle β to form a T-shape trench 820. Since the fourth, fifth, sixth and seventh (or eighth) trenches, 530, 540, 625 and 725 (or 726) are defined by the first, second, third and fourth patterned resist layers, 410, 510, 610 and 710, respectively, rounded corner distortions induced in the lithography exposing process are greatly reduced. The first, second and third connecting angles, θ, α and β, are about 90 degree.

FIGS. 15D-15E also show that, in some embodiments, the sixth trench 625 is formed to have trench ends 625A and 625B extending outside the fourth trench 530 and fifth trench 540, respectively, and the seventh (or eighth) trench 725 (or 726) has a trench end 725A extending outside the fourth trench 530. All these trench ends provide insurance-like portions for reducing adverse impacts of line end shortening distortion.

Figure 16C:
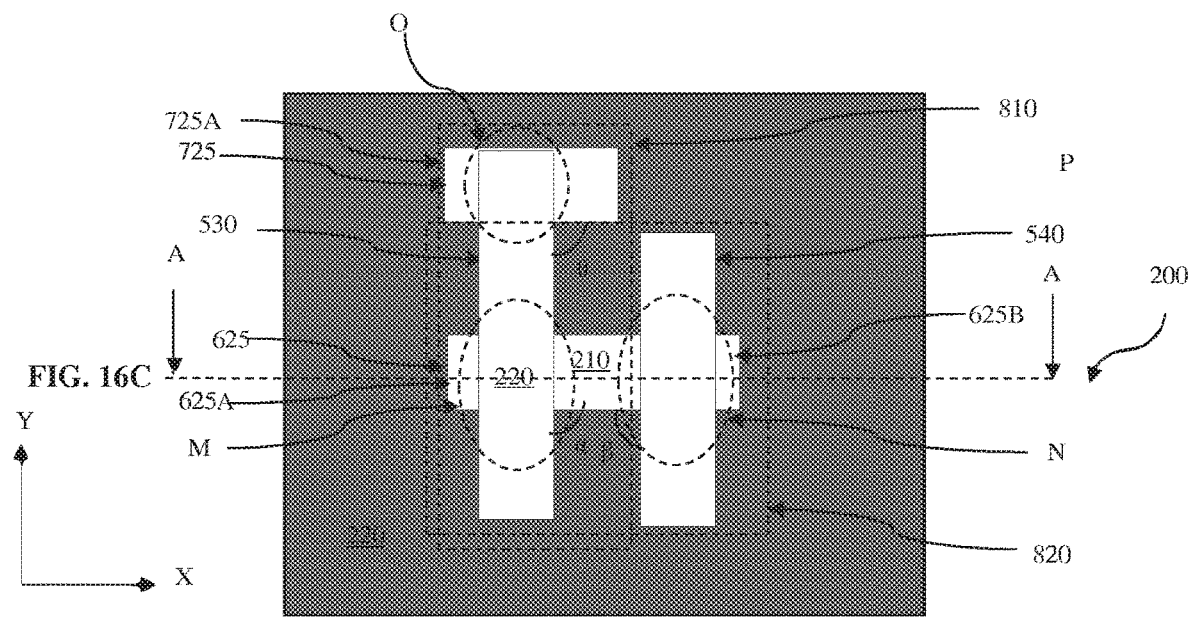
Figure 16D:
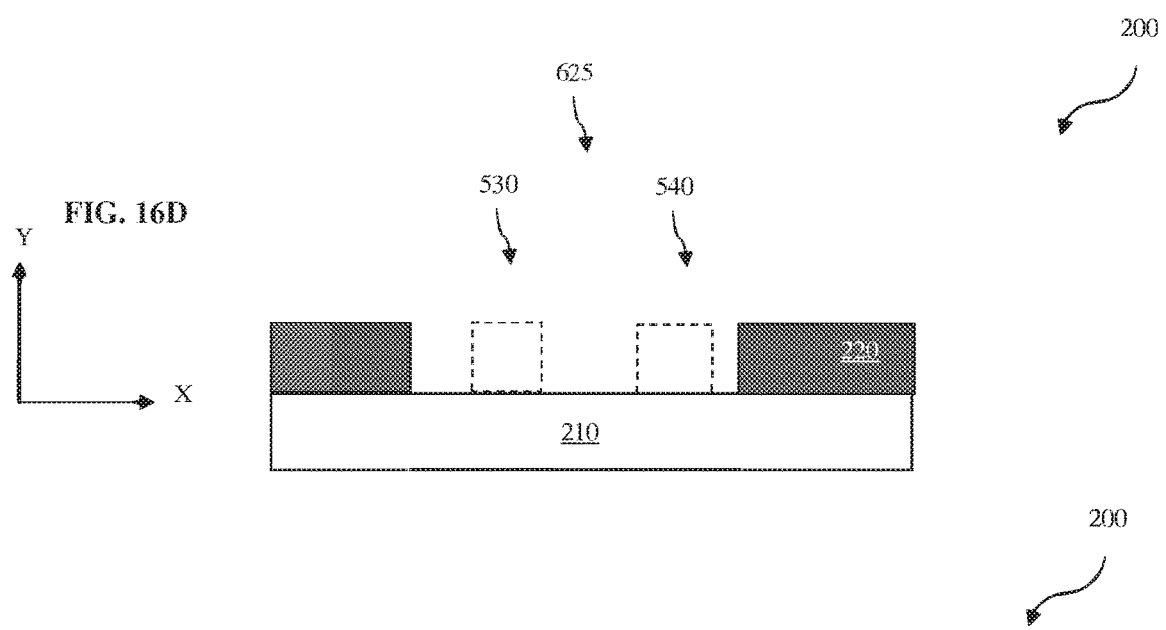

Referring to FIGS. 1 and 16A-16B, the method 100 proceeds to step 130 by etching the first material layer 220, using the material layer 230 as an etch mask, to transfer the fifth, sixth and seventh (or eighth) trenches, 530, 540, 625 and 725 (or 726) to the first material layer 220, with 90-degree connecting angles θ and regular line-end contour (such as a rectangular contour). In some embodiment, respective portions of the substrate 210 are exposed in the fifth, sixth and seventh (or eighth) trenches, 530, 540, 625 and 725 (or 726). In present embodiment, the etch process is properly chosen to selectively etch the first material layer 220 but does not substantially etch the second material layer 230. The etch process includes an anisotropic dry etch. For example, the etch process is a plasma anisotropic etch. The second material layer 230 is then removed by a proper etch process, as shown in FIGS. 16C-16D.

Figure 17A:
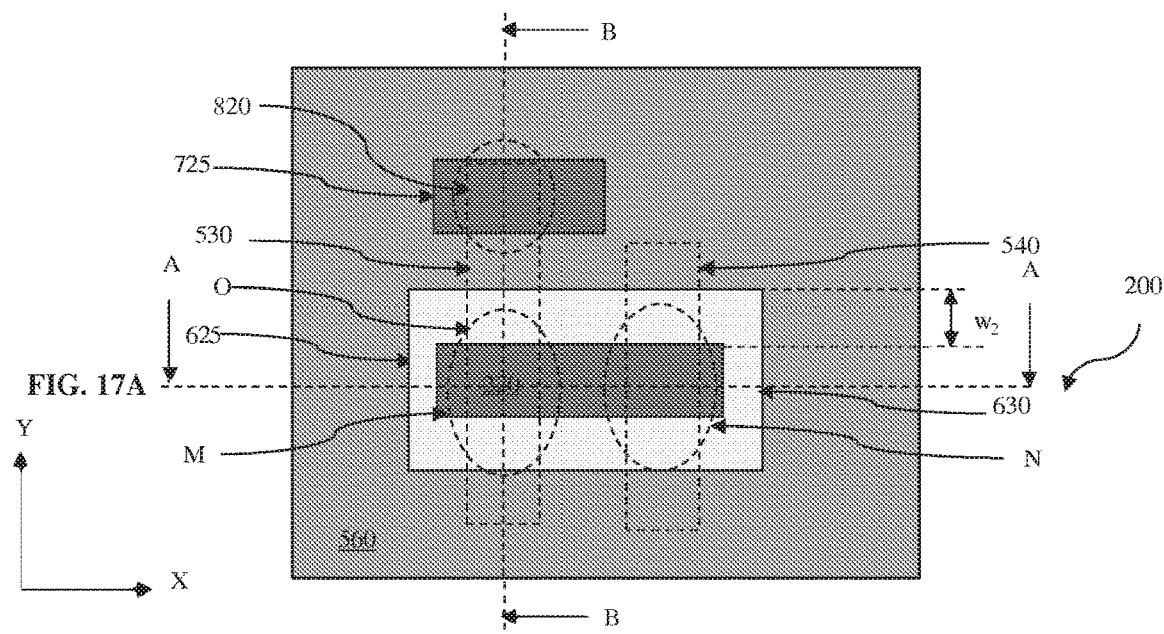
FIG. 17A is a top view of an example of a semiconductor device in accordance with some embodiments.
Figure 17B:
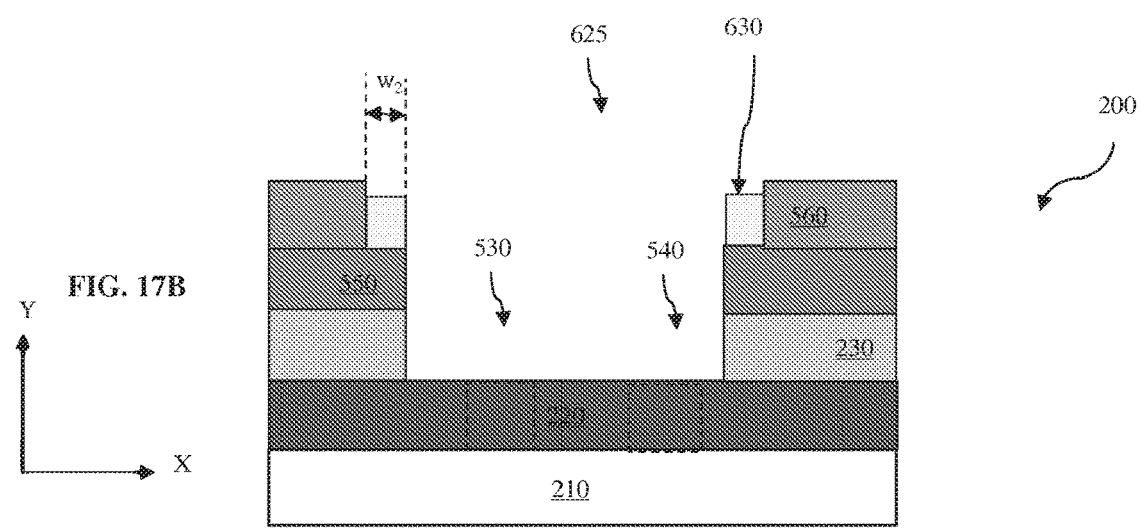
FIG. 17B is a cross-sectional view of an example semiconductor device in accordance with some embodiments, along the line A-A in FIG. 17A.
Figure 17C:
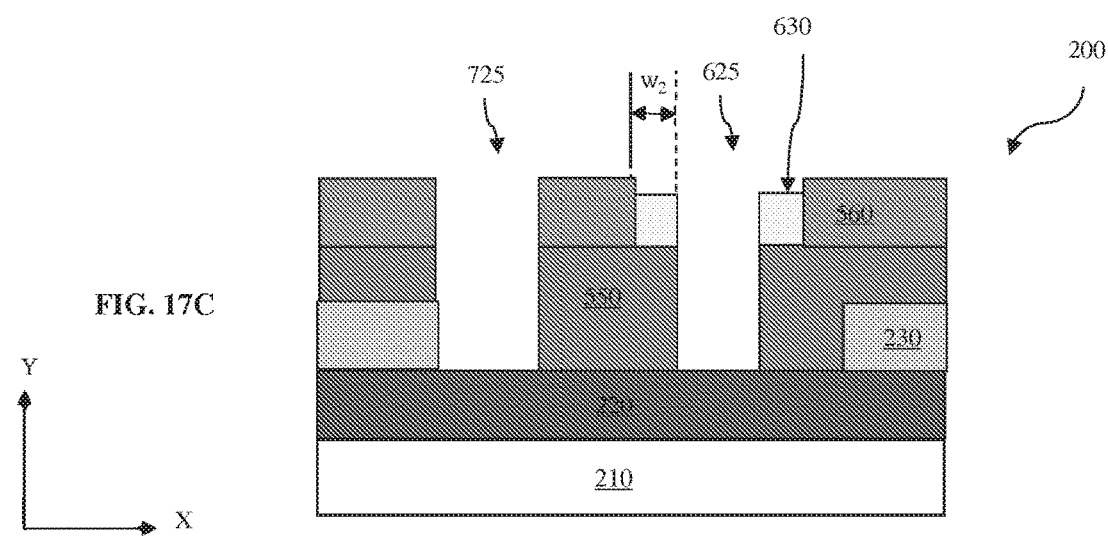
FIG. 17C is a cross-sectional view of an example semiconductor device in accordance with some embodiments, along the line B-B in FIG. 17A.

Additional steps can be provided before, during, and after the method 100, and some of the steps described can be replaced, eliminated, or moved around for additional embodiments of the method 100. Other alternatives or embodiments may present without departure from the spirit and scope of the present disclosure. For example, in some embodiments, in step 126, not only the planarization layer 550 but also the second material layer 230 is etched through the sixth and seventh trenches, 625 and 725 to extend the sixth and seventh trenches, 625 and 725 to the planarization layer 550, as shown in FIGS. 17A-17C. The etch process is properly chosen to selectively etch the planarization layer 550 and the second material layer 230, but does not substantially etch the second HM 560 and the second spacer 630. Thus, the second HM 560 and the second spacer 630 serve as an etching-mask. The second HM 560, the second spacer 630 and the planarization layer 550 are then removed by other proper etching processes, as shown in FIGS. 15D-15E.

The semiconductor device 200 may undergo further CMOS or MOS technology processing to form various features and regions known in the art. For example, subsequent processing may form metal lines in the fifth, sixth and seventh (or eighth) trenches, 530, 540, 625 and 725 (or 726). For another example, various contacts/vias and multilayers interconnect features (e.g., interlayer dielectrics) over the substrate 210, configured to connect the various features or structures of the semiconductor device 200.

Based on the above, it can be seen that the present disclosure provides methods of forming L-shape and T-shape trenches and trenches which have small space between each other. The method employs forming a L-shape or T-shape trench by two sub-trenches formed by two individual lithography/etch cycles. The two sub-trenches are formed extending along two directions perpendicular to each other. The method also employs guarding-spacers to ensure a space between trenches. The method demonstrates reducing rounded corner distortion in forming the L-shape or T-shape trench. The method also demonstrates reducing line end shortening distortion and overcoming misalignment in forming trenches having small spacing between each other.

The present disclosure provides many different embodiments of fabricating a semiconductor device that provide one or more improvements over existing approaches. In one embodiment, a method for fabricating a semiconductor device includes forming a material layer over a substrate, forming a first hard mask (HM) layer over the material layer, forming a first trench in the first HM layer. The first trench extends along a first direction. The method also includes forming first spacers along sidewalls of the first trench, forming a second trench in the first HM layer parallel to the first trench, by using the first spacers to guard the first trench. The method also includes etching the material layer through the first trench and the second trench, removing the first HM layer and the first spacers, forming a second HM layer over the material layer, forming a third trench in the second HM layer. The third trench extends along a second direction that is perpendicular to the first direction. The third trench overlaps with the first trench. The method also includes etching the material layer through the third trench.

In another embodiment, a method includes forming a material layer over a substrate, forming a first hard mask (HM) layer over the material layer, forming a first trench in the first HM layer. The first trench extends along a first direction. The method also includes forming first spacers along sidewalls of the first trench, forming a second trench in the first HM layer parallel to the first trench, by using the first spacers to guard the first trench. The method also includes etching the material layer through the first trench and the second trench, removing the first HM layer and the first spacers, forming a planarization layer over the material layer, including filling in the first trench and the second trench. The method also includes forming a second HM layer over the planarization layer, forming a third trench in the second HM layer. The third trench extends along a second direction that is perpendicular to the first direction and overlaps with the first trench at an end of the first trench. The method also includes transferring the third trench to the planarization layer, removing the second HM layer and the second spacers and etching the material layer through the third trench in the planarization layer.

In yet another embodiment, a method includes forming a material layer over a main layer, forming a first hard mask (HM) layer over the material layer, forming a first trench in the first HM layer. The first trench extends along a first direction. The method also includes forming first spacers along sidewalls of the first trench, forming a second trench in the first HM layer parallel to the first trench, by using the first spacers to guard the first trench. The method also includes etching the material layer through the first trench and the second trench, removing the first HM layer and the first spacers, forming a planarization layer over the material layer, including filling in the first trench and the second trench. The method also includes forming a second HM layer over the planarization layer, forming a third trench in the second HM layer. The third trench extends along a second direction that is perpendicular to the first direction and overlaps with the first trench at an end of the first trench. The method also includes etching the planarization layer and the material layer through the third trench, removing the second HM layer, second spacers and the planarization layer and etching the main layer by using the material layer, which has the first, second and third trenches, as an etch mask to transfer the first trench, the second trench and third trench to the main layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first material layer over a substrate;
   forming a first hard mask layer over the first material layer;
   forming a first trench in the first hard mask layer, wherein the first trench extends along a first direction;
   after forming the first trench in the first hard mask layer, forming a patterned resist layer on the first hard mask layer including within the first trench;
   forming a second trench in the first hard mask layer while using the patterned resist layer as a mask;
   removing the patterned resist layer;
   removing a first portion of the first material layer to extend the first trench into the first material layer and removing a second portion of the first material layer to extend the second trench into the first material layer to thereby forming a patterned first material layer;
   after removing the first portion and the second portion of the first material layer, removing the first hard mask layer;
   forming a patterned second material layer over the patterned first material layer;
   forming a third trench extending through the patterned second material, wherein the third trench extends along a second direction that is different than the first direction, wherein the third trench overlaps the extended first trench; and
   removing a third portion of the first material layer through the third trench.

2. The method of claim 1, wherein forming the patterned second material layer over the patterned first material layer includes:
   forming a second material layer over the patterned second material layer including within the extended first trench;
   performing a planarization process on the second material layer;
   forming a patterned hard mask layer over the second material layer, the patterned hard mask layer including an opening that exposes the second material layer;
   forming a first spacer layer in the opening; and
   removing the exposed second material layer through the opening to form the patterned second material layer.

3. The method of claim 2, wherein removing the exposed second material layer through the opening to form the patterned second material layer includes removing the second material from within the extended first trench.

4. The method of claim 2, further comprising removing the first spacer layer from the opening prior to removing the third portion of the first material layer through the third trench.

5. The method of claim 1, further comprising forming a first spacer layer in the first trench prior to forming the patterned resist layer on the first hard mask layer including within the first trench.

6. The method of claim 5, wherein the removing of the first hard mask layer includes removing the first spacer layer.

7. The method of claim 1, further comprising:
   forming a second material layer over the substrate prior to forming the first material layer over the substrate, the second material layer formed of a material selected from the group consisting of a dielectric material and a conductive material; and
   after removing the third portion of the first material layer through the third trench, patterning the second material layer by using the first material layer as a mask.

8. A method comprising:
   forming a first material layer over a substrate;
   forming a first hard mask layer over the first material layer;
   forming a first trench in the first hard mask layer, wherein the first trench extends along a first direction;
   forming a first spacer layer within the first trench, wherein a first portion of the first material layer is exposed within the first trench after the forming of the first spacer layer;
   removing the first portion of the first material layer to extend the first trench into the first material thereby forming a patterned first material layer;
   after removing the first portion of the first material layer, removing the first hard mask layer and the first spacer layer;
   forming a second patterned material layer over the patterned first material layer;
   forming a second trench extending through the second patterned material layer, wherein the second trench extends along a second direction that is different than the first direction, wherein the second trench overlaps the extended first trench; and
   removing a second portion of the patterned first material layer through the second trench.

9. The method of claim 8, further comprising after forming the first spacer layer within the first trench, forming a third trench in the first hard mask layer that exposes a third portion of the first material layer, wherein the third trench extends along the first direction.

10. The method of claim 9, wherein the removing the first portion of the first material layer to extend the first trench into the first material thereby forming a patterned first material layer further includes removing the third portion of the first material layer to extend the third trench into the first material layer.

11. The method of claim 10, wherein the second trench overlaps the extended third trench.

12. The method of claim 8, wherein forming the second patterned material layer over the patterned first material layer includes forming the second patterned material layer directly on the patterned first material layer such that the patterned second material layer interfaces with the patterned first material layer.

13. The method of claim 8, wherein the second trench overlaps an end portion of the extended first trench.

14. The method of claim 8, wherein the second trench overlaps a middle portion of the extended first trench.

15. A method comprising:
   forming a patterned second material layer over a first material layer, the patterned second material layer including a first trench;

forming a patterned third material layer over the patterned second material layer, wherein the patterned third material layer has a first opening and a second opening, the first opening overlapping a first portion of the first trench and the second opening overlapping a second portion of the first trench;

removing a portion of the patterned second material layer through the patterned third material layer to form a second trench in the patterned second material layer; and removing a portion of the first material layer through the first and second trenches, and wherein the first material layer includes a material selected from the group consisting of a conductive material and a dielectric material.

16. The method of claim 15, wherein forming the patterned third material layer over the patterned second material layer includes:

forming a third material layer over the patterned second material layer;

forming a patterned hard mask layer over the third material layer, the patterned hard mask layer including a third opening, wherein the third material layer is exposed within the third opening;

forming a first spacer layer in the third opening; and removing the exposed third material layer through the third opening to form the patterned third material layer.

17. The method of claim 16, wherein the first spacer layer is disposed in the third opening during the removal of the exposed third material layer.

18. The method of claim 16, further comprising removing the spacer layer from within the third opening prior to removing the portion of the patterned second material layer through the patterned third material layer to form the second trench in the patterned second material layer.

19. The method of claim 15, wherein the forming of the patterned second material layer over the first material layer includes:

forming a patterned hard mask layer directly on a second material layer, the patterned hard mask layer including a third opening exposing the second material layer;

forming a spacer layer directly on the exposed second material layer within the third opening;

forming a patterned resist layer over the patterned hard mask layer including within the third opening;

removing the patterned resist from within the third opening;

patterning the second material layer while using the spacer layer as a mask to thereby form the first trench; and removing the spacer layer and the patterned hard mask layer form over the patterned second material layer.

20. The method of claim 19, wherein the patterned resist layer includes a fourth opening exposing a portion of the patterned hard mask layer, the method further comprising forming a fifth opening in the patterned hard by removing the portion of the patterned hard mask layer through the fourth opening in the patterned resist layer, and wherein the patterning of the second material layer while using the spacer layer as the mask to thereby form the first trench further includes removing a portion of the second material layer thorough the fifth opening of the patterned hard mask layer.

* * * * *